(12) United States Patent
Shibazaki

(10) Patent No.: US 8,553,204 B2
(45) Date of Patent: Oct. 8, 2013

(54) MOVABLE BODY APPARATUS, EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 550 days.

(21) Appl. No.: 12/782,310

(22) Filed: May 18, 2010

(65) Prior Publication Data

US 2010/0296071 A1 Nov. 25, 2010

Related U.S. Application Data

(60) Provisional application No. 61/179,856, filed on May 20, 2009.

(51) Int. Cl.
  *G03B 27/58* (2006.01)
  *G03B 27/42* (2006.01)
  *G01B 11/14* (2006.01)
  *G03F 7/20* (2006.01)

(52) U.S. Cl.
  CPC ........ *G03F 7/70775* (2013.01); *G03F 7/70725* (2013.01)
  USPC ............................... 355/72; 355/53; 356/616

(58) Field of Classification Search
  CPC ............ G03F 7/70691; G03F 7/70775; G03F 7/70758; G03F 7/70716; G03F 7/70725
  USPC ....... 355/53, 72, 77; 356/614–618; 359/566
  See application file for complete search history.

(56) References Cited

U.S. PATENT DOCUMENTS

| 4,780,617 A | 10/1988 | Umatate et al. |
|---|---|---|
| 5,196,745 A | 3/1993 | Trumper |
| 5,448,332 A | 9/1995 | Sakakibara et al. |
| 5,610,715 A | 3/1997 | Yoshii et al. |
| 5,646,413 A | 7/1997 | Nishi |
| RE37,391 E | 9/2001 | Nishi |
| 6,341,007 B1 * | 1/2002 | Nishi et al. ..................... 355/53 |
| 6,611,316 B2 | 8/2003 | Sewell |
| 6,778,257 B2 | 8/2004 | Bleeker et al. |
| 7,023,610 B2 | 4/2006 | Ohtsuki et al. |
| 7,238,931 B2 | 7/2007 | Nabeshima et al. |

(Continued)

FOREIGN PATENT DOCUMENTS

| WO | WO 01/35168 A1 | 5/2001 |
|---|---|---|
| WO | WO 2006/038952 A2 | 4/2006 |
| WO | WO 2009/050675 A2 | 4/2009 |
| WO | WO 2010/032884 A1 | 3/2010 |

OTHER PUBLICATIONS

International Search Report issued in International Application No. PCT/JP2010/058947 dated Nov. 3, 2010.

(Continued)

*Primary Examiner* — Steven H Whitesell Gordon
(74) *Attorney, Agent, or Firm* — Oliff & Berridge, PLC

(57) ABSTRACT

A fine movement stage is driven by a controller, based on positional information of the fine movement stage in a measurement direction measured by a measurement system and correction information of a measurement error caused by a tilt of the fine movement stage included in the positional information. Accordingly, driving the fine movement stage with high precision becomes possible, which is not affected by a measurement error included in the positional information in a measurement direction of the measurement system that occurs due to a tilt of the fine movement stage.

39 Claims, 11 Drawing Sheets

(56) References Cited

U.S. PATENT DOCUMENTS

| | | |
|---|---|---|
| 7,362,446 B2 * | 4/2008 | Van Der Pasch et al. ..... 356/499 |
| 7,561,280 B2 | 7/2009 | Schluchter et al. |
| 2001/0035168 A1 | 11/2001 | Meyer et al. |
| 2002/0041377 A1 | 4/2002 | Hagiwara et al. |
| 2003/0025890 A1 | 2/2003 | Nishinaga |
| 2005/0236558 A1 * | 10/2005 | Nabeshima et al. .......... 250/221 |
| 2006/0187431 A1 | 8/2006 | Shibazaki |
| 2007/0035267 A1 | 2/2007 | Gao et al. |
| 2007/0263191 A1 | 11/2007 | Shibazaki |
| 2007/0288121 A1 | 12/2007 | Shibazaki |
| 2008/0043212 A1 | 2/2008 | Shibazaki |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094594 A1 | 4/2008 | Shibazaki |
| 2008/0094604 A1 | 4/2008 | Shibazaki |
| 2008/0106722 A1 | 5/2008 | Shibazaki |
| 2008/0218713 A1 | 9/2008 | Shibazaki |
| 2009/0284724 A1 | 11/2009 | Kanaya |
| 2010/0073661 A1 | 3/2010 | Shibazaki et al. |
| 2010/0081095 A1 | 4/2010 | Shibazaki |
| 2010/0259768 A1 | 10/2010 | Frissen et al. |

OTHER PUBLICATIONS

Written Opinion issued in International Application No. PCT/JP2010/058947 dated Nov. 3, 2010.

* cited by examiner

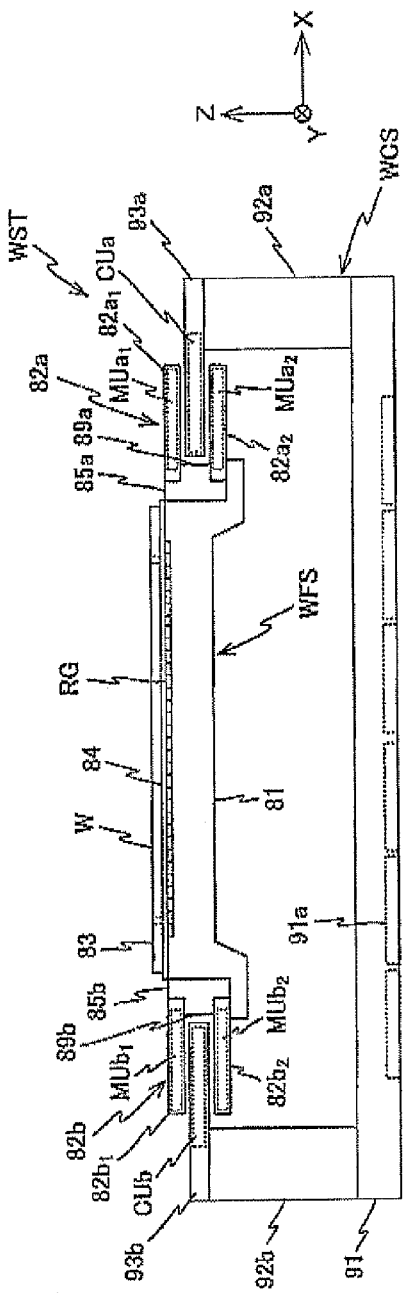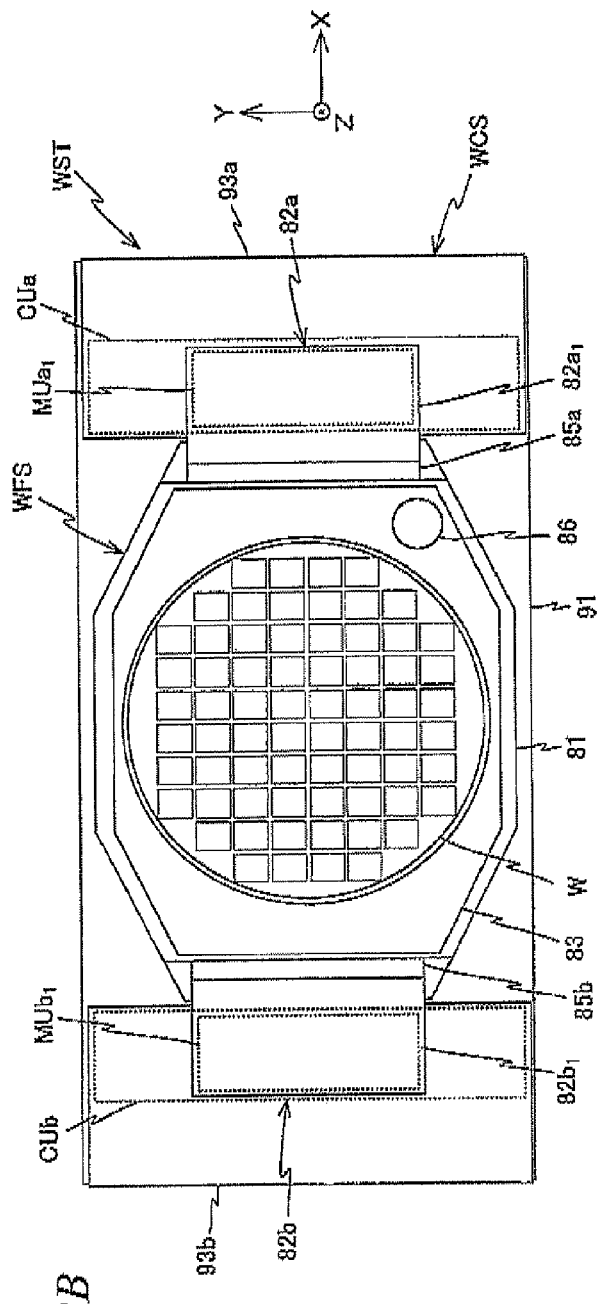
Fig. 2A
Fig. 2B

MOVABLE BODY APPARATUS, EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/179,856 filed May 20, 2009, the disclosure of which is hereby incorporated herein by reference in its entirety.

BACKGROUND OF THE INVENTION

1. Field of the Invention

The present invention relates to movable body apparatus, exposure apparatus, exposure methods, and device manufacturing methods, and more particularly, to a movable body apparatus including a movable body which is movable along a two-dimensional plane, an exposure apparatus equipped with the movable body apparatus, an exposure method in which an energy beam is irradiated on an object on the movable body to form a predetermined pattern, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

In these types of exposure apparatuses, the position of a wafer stage which moves two-dimensionally, holding a sensitive object (hereinafter generally referred to as a wafer) such as a wafer or a glass plate on which a pattern is formed, was measured by a laser interferometer in general. However, requirements for a wafer stage position control performance with higher precision are increasing due to finer patterns that accompany higher integration of semiconductor devices recently, and as a consequence, short-term variation of measurement values due to temperature fluctuation and/or the influence of temperature gradient of the atmosphere on the beam path of the laser interferometer can no longer be ignored.

To improve such an inconvenience, various inventions related to an exposure apparatus that has employed an encoder having a measurement resolution at the same level or better than a laser interferometer as the position measuring device of the wafer stage have been proposed (refer to, for example, U.S. Patent Application Publication No. 2008/0088843). However, in the liquid immersion exposure apparatus disclosed in U.S. Patent Application Publication No. 2008/0088843 and the like, there still were points that should have been improved, such as a threat of the wafer stage (a grating installed on the wafer stage upper surface) being deformed when influenced by heat of vaporization and the like when the liquid evaporates.

To improve such an inconvenience, for example, in U.S. Patent Application Publication No. 2008/0094594, as a fifth embodiment, an exposure apparatus is disclosed which is equipped with an encoder system that has a grating arranged on the upper surface of a wafer stage configured by a light transmitting member and measures the displacement of the wafer stage related to the periodic direction of the grating by making a measurement beam from an encoder main body placed below the wafer stage enter the wafer stage and be irradiated on the grating, and by receiving a diffraction light which occurs in the grating. In this apparatus, because the grating is covered with a cover glass, the grating is immune to the heat of vaporization, which makes it possible to measure the position of the wafer stage with high precision.

However, it was difficult to employ the placement of the encoder main body related to the fifth embodiment of Patent Application Publication No 2008/0094594 in the case of measuring positional information of a fine movement stage in a so-called coarse/fine movement structure, which includes a coarse movement stage that moves on a surface plate and a fine movement stage that holds a wafer and moves on the coarse movement stage. This was because the coarse movement stage placed above the surface plate interferes with the measurement beam from the encoder main, body which is irradiated on the fine movement stage placed further above.

Further, while it is desirable to measure positional information of the wafer stage within the two-dimensional plane the same as the exposure point on the wafer surface when exposure to the wafer on the wafer stage is performed, in the case when the wafer stage is inclined with respect to the two-dimensional plane, measurement errors which are caused by a height difference of a wafer surface and a placement surface of the grating would be included, for example, in measurement values of an encoder which measures the position of the wafer stage from below.

SUMMARY OF THE INVENTION

According to a first aspect of the present invention, there is provided a movable body apparatus, comprising: a movable body which is movable substantially along a predetermined plane holding an object, and has a grating placed on a plane on a rear surface side of the object substantially parallel with the predetermined plane; a measurement system which irradiates a measurement light of a predetermined wavelength toward the grating from outside on an opposite side of a mounting surface of the object, receives diffraction light from the grating originating from the measurement light, and measures positional information of the movable body in a measurement direction within the predetermined plane; and a drive system which drives the movable body, based on positional information in the measurement direction of the movable body and correction information of a measurement error caused by a tilt of the movable body included in the positional information.

According to the apparatus, the movable body is driven by the drive system; based on the positional information in the measurement direction of the movable body measured by the measurement system and the correction information of the measurement error caused by a tilt of the movable body included in the positional information. Accordingly, driving the movable body with high precision becomes possible, which is not affected by a measurement error included in the positional information in a measurement direction of the measurement system that occurs due to a tilt of the movable body.

According to a second aspect of the present invention, there is provided an exposure apparatus that forms a pattern on an object by an irradiation of an energy beam, the apparatus comprising: a patterning device that irradiates the energy beam on the object; and the movable body apparatus of the present invention in which the object on which an energy beam is irradiated is held by the movable body.

According to the exposure apparatus, because the movable body holding the object on which the energy beam is irradiated is driven with high precision by the movable body apparatus of the present invention, by irradiating the energy beam on the object from the patterning device, exposure with high precision of the object, or more specifically, forming a pattern with high precision becomes possible.

According to a third aspect of the present invention, there is provided a device manufacturing method, including exposing a substrate using the exposure apparatus of the present invention; and developing the substrate which has been exposed.

According to a fourth aspect of the present invention, there is provided an exposure method in which an energy beam is irradiated on an object to form a predetermined pattern on the object, the method comprising: measuring positional information of a movable body in a measurement direction within a predetermined plane by moving the movable body that holds the object, and also has a grating placed along a surface substantially parallel to a predetermined plane on a rear surface side of the object, along the predetermined plane, irradiating a measurement light of the predetermined wavelength toward the grating from outside the movable body on an opposite side of a mounting surface of the object, and receiving a diffraction light from the grating originating from the measurement light; and driving the movable body, based on positional information in the measurement direction of the movable body and correction information of a measurement error caused by a tilt of the movable body included in the positional information.

According to the method, the movable body is driven, based on the positional information in the measurement direction of the movable body which is measured and the correction information of the measurement error occurring due to a tilt of the movable body included in the positional information. Accordingly, driving the movable body with high precision becomes possible, which is not affected by a measurement error included in the positional information in a measurement direction of the measurement system that occurs due to a tilt of the movable body.

According to a fifth aspect of the present invention, there is provided a device manufacturing method, including exposing a substrate using the exposure method of the present invention; and developing the substrate which has been exposed.

BRIEF DESCRIPTION OF THE DRAWINGS

In the accompanying drawings;

FIG. 2A shows a side view of a stage unit which the exposure apparatus in FIG. 1 is equipped with when viewed from a −Y direction, and FIG. 2B is the stage device shown in a planar view;

DESCRIPTION OF THE EMBODIMENTS

An embodiment of the present invention will be described below, with reference to FIGS. 1 to 10B.

Figure 1:
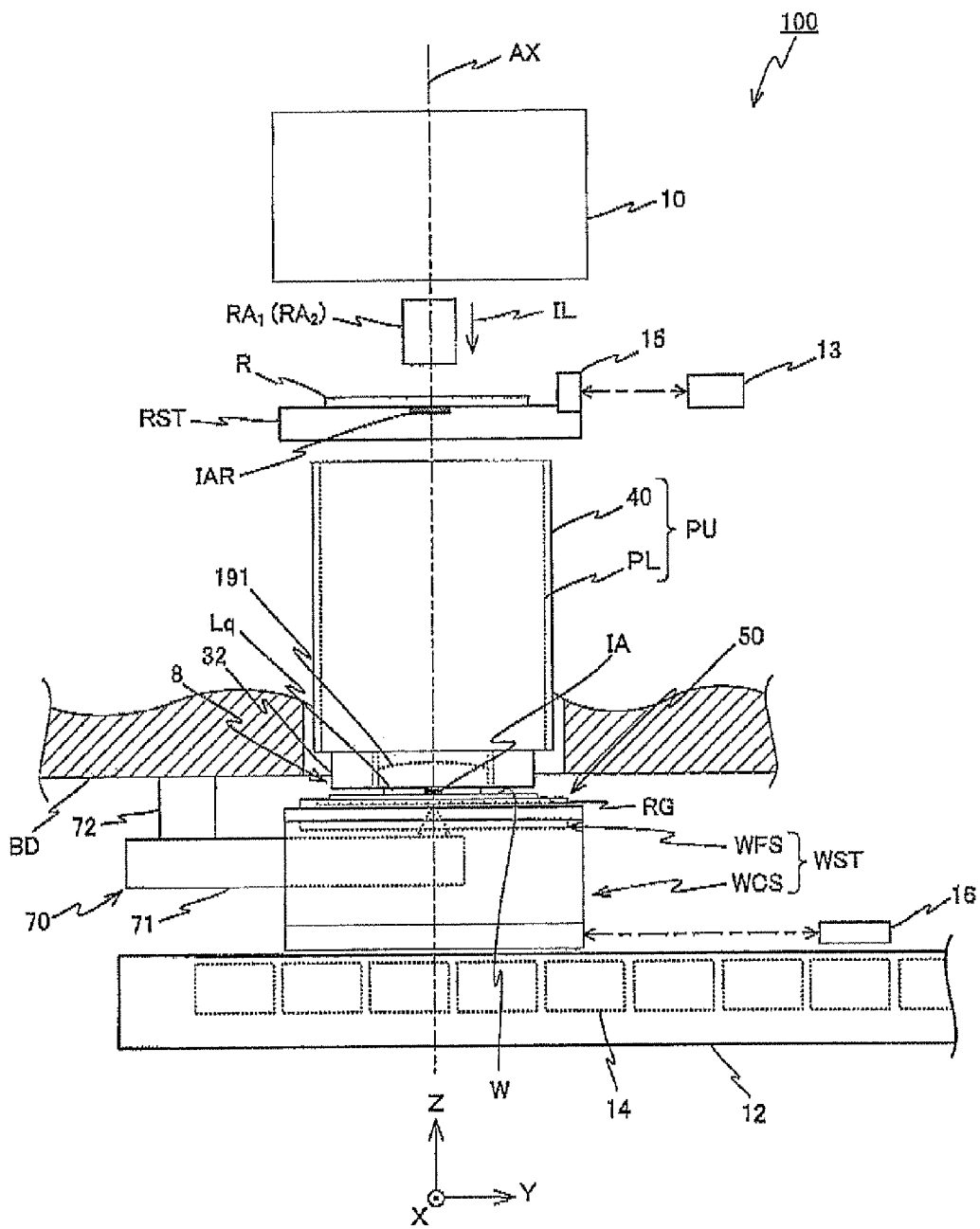
FIG. 1 is a view that schematically shows a configuration of an exposure apparatus of an embodiment.

FIG. 1 shows a schematic configuration of an exposure apparatus 100 in the embodiment. Exposure apparatus 100 is a projection exposure apparatus by the step-and-scan method, or a so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis direction and the Y-axis direction will be described as the X-axis direction, and rotational (inclination) directions around the X-axis, the Y-axis, and the Z-axis will be described as θ x, θ y, and θ z directions, respectively.

Exposure apparatus 100 is equipped with an illumination system 10, a reticle stage RST, a projection unit PU, a local liquid immersion device 8, a stage device 50 which has a fine movement stage WFS (also referred to as a table), and a control system of these sections and the like. In FIG. 1, a wafer W is mounted on fine movement stage WFS.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. Illumination system 10 illuminates a slit-shaped illumination area IAR which is set on a reticle R with a reticle blind (also referred to as a masking system) by an illumination light (exposure light) IL with a substantially uniform illuminance. Here, as an example, ArF excimer laser light (with a wavelength of 193 nm) is used as illumination light IL.

On reticle stage RST, reticle R on which a circuit pattern or the like is formed on its pattern surface (the lower surface in FIG. 1) is fixed, for example, by vacuum chucking. Reticle stage RST is finely drivable within an XY plane, for example, by a reticle stage drive section 11 (not shown in FIG. 1, refer to FIG. 3) that includes a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θ z direction) of reticle stage RST in the XY plane is constantly detected, for example, at a resolution of around 0.25 nm by a reticle laser interferometer (hereinafter referred to as a "reticle interferometer") 13, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction) fixed on reticle stage RST. The measurement values of reticle interferometer 13 are sent to a main controller 20 (not shown in FIG. 1, refer to FIG. 3). Incidentally, positional information of reticle stage RST can be measured by an encoder system as is disclosed in, for example, U.S. Patent Application Publication 2007/0288121 and the like.

Projection unit PU is placed below reticle stage RST (on the −Z side) in FIG. 1. Projection unit PU is supported via a flange portion provided in the outer periphery of the projection unit, by a main frame (also called a metrology frame) BD supported horizontally by a support member (not shown). Projection unit PU includes a barrel 40, and projection optical system PL consisting of a plurality of optical elements held by barrel 40. As projection optical system PL, for example, a both-side telecentric dioptric system that has a predetermined projection magnification (such as one-quarter, one-fifth, or one-eighth times) is used. Therefore, when illumination system 10 illuminates illumination area IAR on reticle R with illumination area IL, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on a wafer W whose surface is coated with a resist (a sensitive agent) and is placed on a second surface (image plane surface) side of projection optical system PL, on an area (hereinafter also referred to as an exposure area) IA conjugate with illumination area IAR. And by reticle stage RST and fine movement stage WFS being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area. That is, in the embodiment, the pattern of reticle R is generated on wafer W according to illumination system 10 and projection optical system PL, and then by the exposure of the sensitive layer (resist layer) on wafer W with illumination light IL, the pattern is formed on wafer W. Now, projection unit PU is held by a main frame BD, and in the embodiment, main frame BD is supported almost horizontally by a plurality of (e.g., three or four) support members which are each placed on an installation surface (floor surface) via a vibration isolation mechanism. Incidentally, the vibration isolation mechanism can be placed between each of the support members and main frame BD. Further, as is disclosed in, for example, PCT International Publication 2006/038952, projection unit PU can be supported by suspension with respect to a main frame member or to a reticle base (not shown), placed above projection unit PU.

Local liquid immersion device 8 includes a liquid supply device 5, a liquid recovery device 6 (both of which are not shown in FIG. 1, refer to FIG. 3), a nozzle unit 32 and the like. As shown in FIG. 1, nozzle unit 32 is supported in a suspended state by a main frame BD supporting projection unit PU and the like via a support member (not shown) so that the periphery of the lower end portion of barrel 40 that holds an optical element closest to the image plane side (the wafer W side) constituting projection optical system PL, in this case, a lens (hereinafter also referred to as a "tip lens") 191, is enclosed. In the embodiment, main controller 20 controls liquid supply device 5 (refer to FIG. 3) and supplies a liquid Lq (refer to FIG. 1) between tip lens 191 and water W via nozzle unit 32, as well as control liquid recovery device 6 (refer to FIG. 3), and recovers liquid Lq from between tip lens 191 and wafer W via nozzle unit 32. During the operations, main controller 20 controls liquid supply device 5 and liquid recovery device 6 so that the quantity of liquid supplied constantly equals the quantity of liquid which has been recovered. Accordingly, a constant quantity of liquid Lq (refer to FIG. 1) is held constantly replaced in the space between tip lens 191 and wafer W. In the embodiment, as liquid Lq above, pure water that transmits the ArF excimer laser beam (light with a wavelength of 193 nm) is to be used.

As shown in FIG. 1, stage device 50 is equipped with a base board 12 which is almost horizontally supported by a vibration isolation mechanism (omitted in drawings) on the floor surface, a wafer stage WST which moves on base board 12 holding wafer W, a wafer stage drive system 53 (refer to FIG. 3), various measurement systems (16, 70 (refer to FIG. 3) and the like) and the like.

Base board 12 is made of a member having a tabular form whose degree of flatness of the upper surface is extremely high, and serves as a guide surface when wafer stage WST moves.

As shown in FIGS. 1, 2A and the like, wafer stage WST has a wafer coarse movement stage (hereinafter, shortly referred to as a coarse movement stage) WCS, which is supported by levitation above base board 12 by a plurality of non-contact bearings (e.g., air bearings (omitted in drawings)) provided on its bottom surface and is driven in an XY two-dimensional direction by a coarse movement stage drive system 51 (refer to FIG. 3) which configures a part of wafer stage drive system 53, and a wafer fine movement stage (hereinafter, shortly referred to as a fine movement stage) WFS, which is supported in a non-contact manner by coarse movement stage WCS and is relatively movable with respect to coarse movement stage WCS. Fine movement stage WFS is driven by a fine movement stage drive system 52 (refer to FIG. 3), which configures a part of wafer stage drive system 53, with respect to coarse movement stage WCS in the X-axis direction, the Y-axis direction, the Z-axis direction, the θx direction, the θy direction, and the θz direction (hereinafter expressed as directions of six degrees of freedom, or directions of six degrees of freedom (X, Y, Z, θx, θy, θz)). In the embodiment, wafer stage drive system 53 is configured, including coarse movement stage drive system 51 and fine movement stage drive system 52.

Positional information (also including rotation information in the θz direction) in the XY plane of wafer stage WST (coarse movement stage WCS) is measured by a wafer stage position measurement system 16. Further, positional information of fine movement stage WFS in directions of six degrees of freedom (X, Y, Z, θx, θy, θz) is measured by a fine movement stage position measurement system 70 (refer to FIG. 3). Measurement results (measurement information) of wafer stage position measurement system 16 and fine movement stage position Measurement system 70 are supplied to main controller 20 (refer to FIG. 3) for position control of coarse movement stage WCS and fine movement stage WFS.

Configuration and the like of each part configuring stage device 50 including the various measurements system described above will be explained in detail, later on.

In exposure apparatus 100, a wafer alignment system ALG (not shown in FIG. 1, refer to FIG. 3) is placed at a position a predetermined distance away on the +Y side from the center of projection unit PU. As alignment system ALG, for example, an FIA (Field Image Alignment) system by an image processing method is used. Wafer alignment system ALG is used by main controller 20 on wafer alignment (e.g., Enhanced Global Alignment (EGA)) when detecting a second fiducial mark that will be described later formed on a measurement plate on fine movement stage WFS, or when detecting an alignment mark on wafer W. Imaging signals of wafer alignment system ALG is supplied to main controller 20 via a signal processing system (not shown). Main controller 20 computes X, Y coordinates of an object mark in a coordinate system at the time of alignment, based on detection results (imaging results) of alignment system ALG and positional information of fine movement stage WFS (wafer W) at the time of detection.

Besides this, in exposure apparatus 100 of the embodiment, a multiple point focal point position detection system (hereinafter shortly referred to as a multipoint AF system) AF (not shown in FIG. 1, refer to FIG. 3) having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 3) via an AF signal processing system (not shown) Main controller 20 detects positional information (surface position information) of the wafer W surface in the Z-axis direction at a plurality of detection points of the multipoint AF system AF based on detection Signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of wafer alignment system ALG, and the so-called focus leveling control of wafer W can be performed at the time of exposure by using the surface position information and measurement values of a laser interferometer system 75 (refer to FIG. 3) configuring a part of fine movement stage position measurement system 70 which will be described later on. Incidentally, measurement values of an encoder system 73 which will be described later configuring fine movement stage position measurement system 70 can also be used, rather than laser interferometer system 75 in focus leveling control.

Further, above reticle stage RST, as is disclosed in detail in, for example, U.S. Pat. No. 5,646,413 and the like, a pair of reticle alignment systems $RA_1$, and $RA_2$ (reticle alignment system $RA_2$ is hidden behind reticle alignment system $RA_1$, in the depth of the page surface in FIG. 1.) of an image processing method that uses a light (in the embodiment, illumination light IL) of the exposure wavelength as an illumination light for alignment is placed. Detection signals of reticle alignment detection systems $RA_1$ and $RA_2$ are supplied to main controller 20 (refer to FIG. 3) via a signal processing system (not shown). Incidentally, reticle alignment systems $RA_1$ and $RA_2$ do not have to be provided. In this case, it is desirable for fine movement stage WFS to have a detection system in which a light transmitting section (light-receiving section) is installed so as to detect a projection image of the reticle alignment mark, as disclosed in, for example, U.S. Patent Application Publication No. 2002/0041377 and the like.

Figure 3:
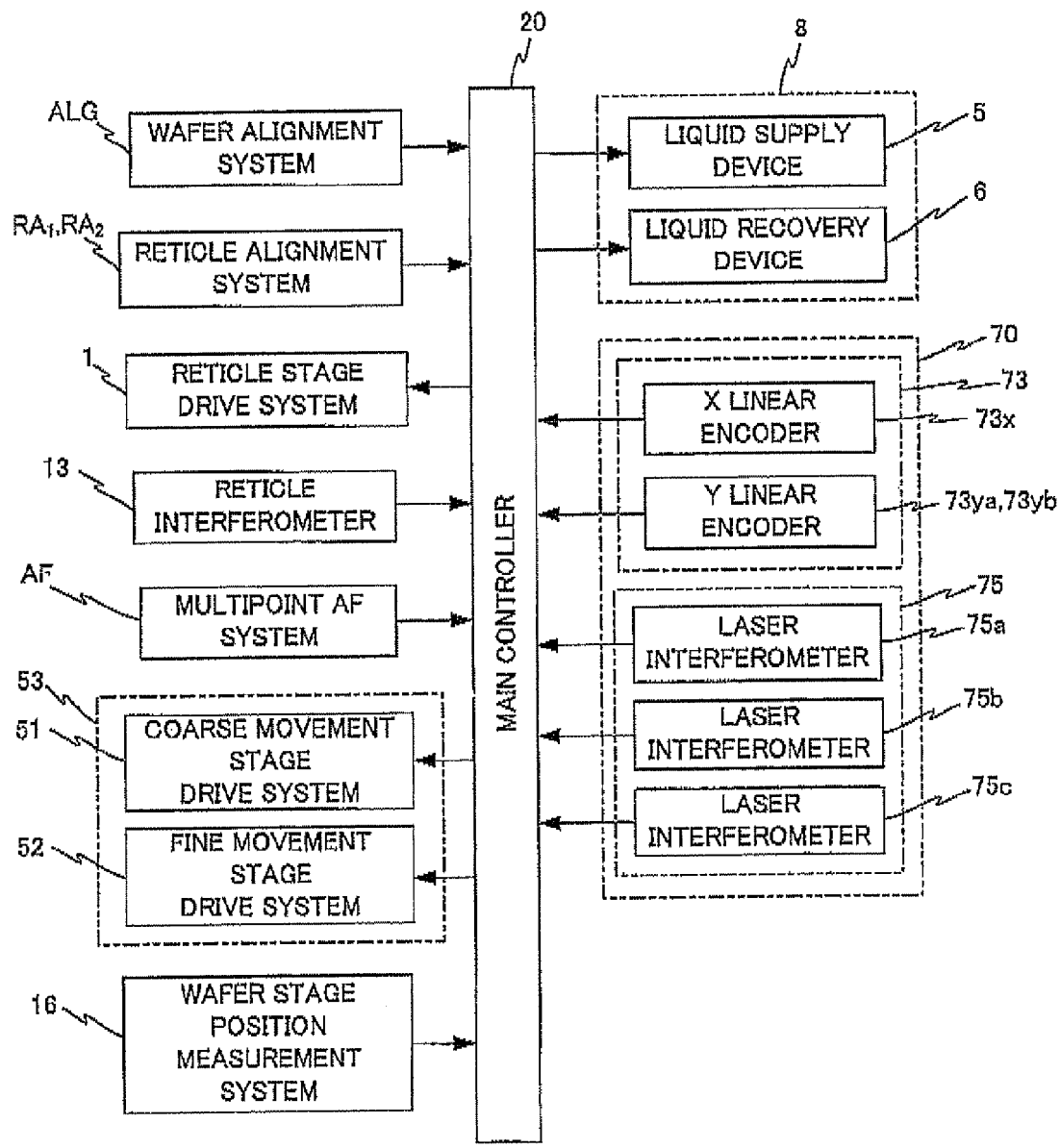
FIG. 3 is a block diagram showing a configuration of a control system of the exposure apparatus in FIG. 1.

FIG. 3 shows the main configuration of the control system of exposure apparatus 100. The control system is mainly configured of main controller 20. Main controller 20 includes a workstation (or a microcomputer) and the like, and has overall control over each part of exposure apparatus 100, such as local liquid immersion device 8, coarse movement stage drive system 51, and fine movement stage drive system 52 previously described.

Now, a configuration and the like of stage device 50 will be described in detail. As shown in FIGS. 2A and 2B, coarse movement stage WCS is equipped with a rectangular plate shaped coarse movement slider section 91 whose longitudinal direction is in the X-axis direction in a planar view (when viewing from the +Z direction), a rectangular plate shaped pair of side wall sections 92a and 92b which are each fixed on the upper surface of coarse movement slider section 91 on one end and the other end in the longitudinal direction in a state parallel to the YZ surface, with the Y-axis direction serving as the longitudinal direction, and a pair of stator sections 93a and 93b that are each fixed on the upper surface of side wall sections 92a and 92b. As a whole, coarse movement stage WCS has a box like shape having a low height whose upper surface in a center in the X-axis direction and surfaces on both sides in the Y-axis direction are open. More specifically, in coarse movement stage WCS, a space is formed inside penetrating in the Y-axis direction.

on the bottom surface of coarse movement stage WCS the bottom surface of coarse movement slider section 91), a magnet unit is fixed consisting of a plurality of permanent magnets placed in the shape of a matrix, as shown in FIG. 2A. In correspondence with the magnet unit, inside base 12, a coil unit is housed, including a plurality of coils 14 placed in the shape of a matrix with the XY two-dimensional direction serving as a row direction and a column direction, as shown in FIG. 1. The magnet unit configures a coarse movement stage drive system 51 consisting of a planar motor employing a Lorentz electromagnetic drive method as is disclosed in, for example, U.S. Pat. No. 5,196,745, along with the coil unit of base board 12. The magnitude and direction of current supplied to each of the coils 14 configuring the coil unit are controlled by main controller 20 (refer to FIG. 3). Coarse movement stage WCS is supported by levitation on base board 12, via a clearance of around several µm, by the air bearings previously described fixed in the periphery of the bottom surface of coarse movement slider section 91 in which the magnet unit described above was provided, and is driven in the X-axis direction, the Y-axis direction, and the θz direction, by coarse movement stage drive system 51. Incidentally, as coarse movement stage drive system 51, the drive method is not limited to the planar motor using the Lorentz electromagnetic force drive method, and for example, a planar motor by a variable reluctance drive system can also be used. Incidentally, the electromagnetic force in the electromagnetic force drive method is not limited to the'Lorentz force. Besides this, coarse movement stage drive system 51 can be configured by a planar motor of a magnetic levitation type. In this case, the air bearings will not have to be arranged on the bottom surface of coarse movement slider section 91.

As shown in FIGS. 2A and 2B, the pair of stator sections 93a and 93b is each made of a member with a tabular outer shape, and in the inside, coil units CUa and CUb are housed to drive fine movement stage WFS. The magnitude and direction of current supplied to each of the coils configuring coil units CUa and Cub are controlled by main controller 20 (refer to FIG. 3). The configuration of coil units CUa and CUb will be described further, later in the description.

As shown in FIGS. 2A and 2B, the pair of stator sections 93a and 93b each have a rectangle tabular shape whose longitudinal direction is in the y-axis direction. Stator section 93a has an end on the +X side fixed to the upper surface of side wall section 92a, and stator section 93b has an end on the −X side fixed to the upper surface of side wall section 92b.

As shown in FIGS. 2A and 2B, fine movement stage WFS is equipped with a main body section 81 consisting of an octagonal plate shape member whose longitudinal direction is in the X-axis direction in a planar view, and a pair of mover sections 82a and 82b that are each fixed to one end and the other end of main body section 81 in the longitudinal direction.

Main body section 81 is formed of a transparent material through which light can pass, so that a measurement beam (a laser beam) of an encoder system which will be described later can proceed inside the main body section. Further, main body section 81 is formed solid (does not have any space inside) in order to reduce the influence of air fluctuation to the laser beam inside the main body section. Incidentally, it is preferable for the transparent material to have a low thermal expansion, and as an example in the embodiment, synthetic quarts (glass) is used. Incidentally, main body section 81 can be structured all by the transparent material or only the section which the measurement beam of the encoder system passes through can be structured by the transparent material, and only the section which this measurement beam passes through can be formed solid.

In the center of the upper surface of main body section 81 (to be more precise, a cover glass which will be described later) of fine movement stage WFS, a wafer holder (not shown) is arranged which holds wafer W by vacuum suction or the like. In the embodiment, for example, a wafer holder of a so-called pin chuck method on which a plurality of support sections (pin members) supporting wafer W are formed within a loop shaped projecting section (rim section) is used, and grating RG to be described later is provided on the other surface (rear surface) of the wafer holder whose one surface (surface) is a wafer mounting surface. Incidentally, the wafer holder can be formed integrally with fine movement stage WFS, or can be fixed to main body section 81, for example, via an electrostatic chuck mechanism, a clamping mechanism, or by adhesion and the like.

Furthermore, on the upper surface of main body section 81 on the outer side of the wafer holder (mounting area of wafer W), as shown in FIGS. 2A and 2B, a plate (a liquid repellent plate) 83 is attached that has a circular opening one size larger than wafer W (the wafer holder) formed in the center, and also has an octagonal outer shape (contour) corresponding to main body section 81. A liquid repellent treatment against liquid Lq is applied to the surface of plate 83 (a liquid repellent surface is formed). Plate 83 is fixed to the upper surface of main body section 81, so that its entire surface (or a part of its surface) becomes substantially flush with the surface of wafer W. Further, in plate 83, a circular opening is formed at one end as shown in FIG. 2B, and inside this opening, a measurement plate 86 is embedded in a state where its surface is substantially flush with the surface of plate 83, or more specifically, the surface of wafer W. On the surface of measurement plate 86, at least the pair of first fiducial marks previously described, and a second fiducial mark detected by wafer alignment system ALG are formed (both the first and second fiducial marks are omitted in the drawing). Incidentally, instead of attaching plate 83 to main body section 81, for example, the wafer holder can be formed integrally with fine movement stage WFS, and a liquid repellent treatment can be applied to the upper surface of fine movement stage WFS in a periphery area (an area the same as plate 83 (can include the surface of measurement plate 86) surrounding the wafer holder.

As shown in FIG. 2A, on the upper surface of main body section 81, a two-dimensional grating (hereinafter merely referred to as a grating) RG is placed horizontally (parallel to the wafer N surface). Grating RG is fixed (or formed) on the upper surface of main body section 81 consisting of a transparent material. Grating RG includes a reflection diffraction grating (X diffraction grating) whose periodic direction is in the X-axis direction and a reflection diffraction grating (Y diffraction grating) whose periodic direction is in the Y-axis direction. In the embodiment, the area (hereinafter, forming area) on main body section 81 where the two-dimensional grating is fixed or formed, as an example, is in a circular shape which is one size larger than wafer W.

Grating RG is covered and protected with a protective member, such as, for example, a cover glass 84. In the embodiment, on the upper surface of cover glass 84, the electrostatic chuck mechanism previously described to hold the wafer holder by suction is provided. Incidentally, in the embodiment, while cover glass 84 is provided so as to cover almost the entire surface of the upper surface of main body section 81, cover glass 84 can be arranged so as to cover only a part of the upper surface of main body section 81 which includes grating RG. Further, while the protective member (cover glass 84) can be formed of the same material as main body section 81, besides this, the protective member can be formed of, for example, metal or ceramics. Further, although a plate shaped protective member is desirable because a sufficient thickness is required to protect grating RG, a thin film protective member can also be used depending on the material.

Incidentally, of the forming area of grating RG, on a surface of cover glass 84 corresponding to an area where the forming area spreads to the periphery of the wafer holder, it is desirable, for example, to provide a reflection member (e.g., a thin film and the like) which covers the forming area, so that the measurement beam of the encoder system irradiated on grating RG does not pass through cover glass 84, or more specifically, so that the intensity of the measurement beam does not change greatly in the inside and the outside of the area on the rear surface of the wafer holder.

As it can also be seen from FIG. 2A, main body section 81 consists of an overall octagonal plate shape member that has an extending section which extends outside on one end and the other end in the longitudinal direction, and on its bottom surface, a recessed section is formed at the section facing grating RG. Main body section 81 is formed so that the center area where grating RG is arranged is formed in a plate shape whose thickness is substantially uniform.

On the upper surface of each of the extending sections on the +X side and the −X side of main body section 81, spacers 85a and 85b having a projecting shape when sectioned are provided, with each of the projecting sections 89a and 89b extending outward in the Y-axis direction.

As shown in FIGS. 2A and 2E, mover section 82a includes two plate-like members $82a_1$ and $82a_2$ having a rectangular shape in a planar view whose size (length) in the Y-axis direction and size (width) in the X-axis direction are both shorter than stator section 93a (around half the size). Plate-like members $82a_1$ and $82a_2$ are both fixed parallel to the XY plane, in a state set apart only by a predetermined distance in the Z-axis direction (vertically), via projecting section 89a of spacer 85a previously described, with respect to the end on the +X side of main body section 81. In this case, the −X side end of plate-like member $82a_2$ is clamped by spacer 85a and the extending section on the +X side of main body section 81. Between the two plate-like members $82a_a$ and $82a_2$, an end on the −X side of stator section 93a is inserted in a non-contact manner. Inside plate-like members $82a_1$ and $82a_2$, magnet units $MUa_1$ and $MUa_2$ which will be described later are housed.

Mover section 82b includes two plate-like members $82b_1$ and $82b_2$ maintained at a predetermined distance in the Z-axis direction (vertically), and is configured in a similar manner with mover section 82a, although being symmetrical. Between the two plate-like members $82b_1$, and $82b_2$, an end on the +X side of stator section 93b is inserted in a non-contact manner. Inside plate-like members $82b_1$ and $82b_2$, magnet units $MUb_1$ and $MUb_2$ are housed, which are configured similar to magnet units $MUa_1$ and $MUa_2$.

Now, as is previously described, because the surface on both sides in the Y-axis direction of coarse movement stage WCS is open, when attaching fine movement stage WFS to coarse movement stage WCS, the position of fine movement stage WFS in the Z-axis direction should be positioned so that stator section 93a, 93b are located between plate-like members $82a_1$ and $82a_2$, and $82b_1$ and $82b_2$, respectively, and then fine movement stage WFS can be moved (slid) in the Y-axis direction after this positioning.

Fine movement stage drive system 52 includes the pair of magnet units $MUa_1$ and $MUa_2$ that mover section 82a previously described has, coil unit CUa that stator section 93a has, the pair of magnet units $MUb_1$ and $MUb_2$ that mover section 82b has, and coil unit CUb that stator section 93b has.

This will be explained further in detail. As it can be seen from FIG. 4, inside stator section 93a at the end on the −X side, two lines of coil rows are placed a predetermined distance apart in the X-axis direction, which are a plurality of (in this case, twelve) YZ coils (hereinafter appropriately referred to as "coils") 55 and 57 that have a rectangular shape in a planar view and are placed equally apart in the Y-axis direction. YZ coil 55 has an upper part winding and a lower part winding in a rectangular shape in a planar view that are disposed such that they overlap in the vertical direction (the Z-axis direction). Further, between the two lines of coil rows described above inside stator section 93a, an X coil (hereinafter shortly referred to as a "coil" as appropriate) 56 is placed, which is narrow and has a rectangular shape in a planar view and whose longitudinal direction is in the Y-axis direction. In this case, the two lines of coil rows and X coil 56 are placed equally spaced in the X-axis direction. Coil unit CUa is configured including the two lines of coil rows and X coil 56.

Incidentally, in the description below, while one of the stator sections 93a and mover sections 82a, which have coil unit Cue and magnet units $MUa_1$ and $MUa_2$, respectively, will be described using FIG. 4, the other (the −X side) stator section 93b and mover section 82b will be structured similar to these sections and will function in a similar manner. Accordingly, coil unit CUb, and magnet units $MUb_1$ and $MUb_2$ are structured similar to coil unit CUa, and magnet units $MUa_1$ and $MUa_2$.

Figure 4:
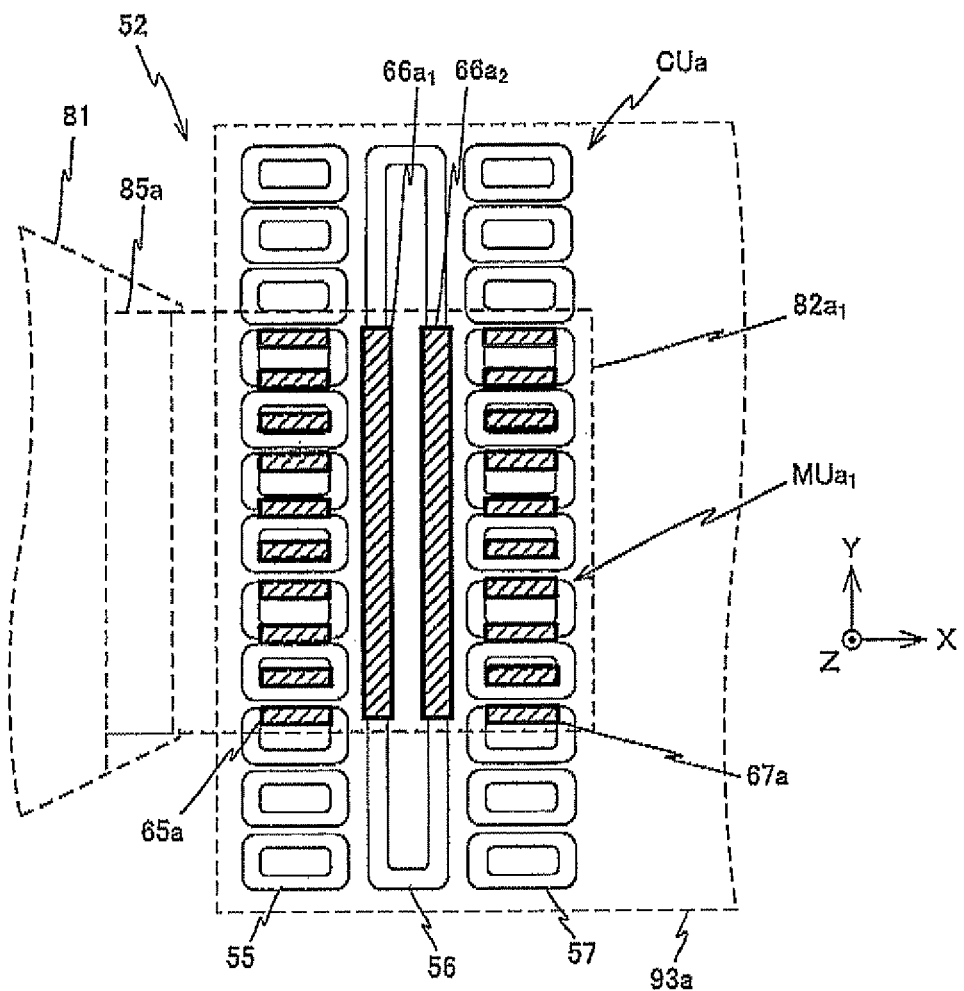
FIG. 4 is a planar view showing a placement of a magnet unit and a coil unit that structure a fine movement stage drive system.

Inside plate-like member $82a_1$ on the +Z side configuring a part of movable section 82a, as it can be seen when referring to FIG. 4, two lines of magnet rows are placed a predetermined distance apart in the X-axis direction, which are a plurality of (in this case, ten) permanent magnets 65a and 67a that have a rectangular shape in a planar view and whose longitudinal direction is in the X-axis direction. The two lines of magnet rows are placed facing coils 55 and 57, respectively. Further, between the two lines of magnet rows described above inside plate-like member $82a_1$, a pair (two) of permanent magnets $66a_1$ and $66a_2$ whose longitudinal direction is in the Y-axis direction is placed set apart in the X axis direction, facing coil 56.

The plurality of permanent magnets 65a is placed in an arrangement where the magnets have a polarity which is alternately a reverse polarity to each other. The magnet row consisting of the plurality of permanent magnets 67a is structured similar to the magnet row consisting of the plurality of permanent magnets 65a. Further, permanent magnets $66a_1$ and $66a_2$ are placed so that the polarity to each other is a reverse polarity. Magnet unit $MUa_1$ is configured by the plurality of permanent magnets 65a and 67a, and $66a_1$ and $66a_2$.

Also inside plate-like member $82a_2$ on the −Z side, permanent magnets are placed in a similar arrangement as in the inside of plate-like member $82a_1$ described above, and magnet unit $MUa_2$ is configured by these permanent magnets.

Now, as for the plurality of permanent magnets 65a placed adjacently in the Y-axis direction, positional relation (each distance) in the Y-axis direction between the plurality of permanent magnets 65 and the plurality of YZ coils 55 is set so that when two adjacent permanent magnets (referred to as a first and second permanent magnet for the sake of convenience) 65a each face the winding section of YZ coil (referred to as a first YZ coil for the sake of convenience) 55, then a third permanent magnet 65a adjacent to these permanent magnets does not face the winding section of a second YZ coil 55 adjacent to the first YZ coil 55 described above (so that the permanent magnet faces the hollow center in the center of the coil, or faces a core to which the coil is wound, such as an iron core) In this case, a fourth permanent magnet 65a and a fifth permanent magnet 65a5 which are each adjacent to the third permanent magnet 65a, face the winding section of a third YZ coil 55, which is adjacent to the second YZ coil 55. The distance in the Y-axis direction between permanent magnets 67a, and the two lines of permanent magnet rows inside plate-like member $82a_2$ on the −Z side is also similar.

Because a placement of each of the coils and permanent magnets as in the description above is employed in the embodiment, main controller 20 can drive fine movement stage WFS in the Y-axis direction by supplying an electric current alternately to the plurality of YZ coils 55 and 57 that are arranged in the Y-axis direction. Further, along with this, by supplying electric current to coils of YZ coils 55 and 57 that are not used to drive fine movement stage WFS in the Y-axis direction, main controller 20 can generate a drive force in the Z-axis direction separately from the drive force in the Y-axis direction and make fine movement stage WFS levitate from coarse movement stage WCs. And, main controller 20 drives fine movement stage WFS in the Y-axis direction while maintaining the levitated state of fine movement stage WFS with respect to coarse movement stage WCS, namely a non-contact state, by sequentially switching the coil subject to current supply according to the position of fine movement stage WFS in the Y-axis direction. Further, main controller 20 can drive fine movement stage WFS in the Y-axis direction in a state where fine movement stage WFS is levitated from coarse movement stage WCS, as well as independently drive the fine movement stage in the X-axis direction.

Figure 5A:
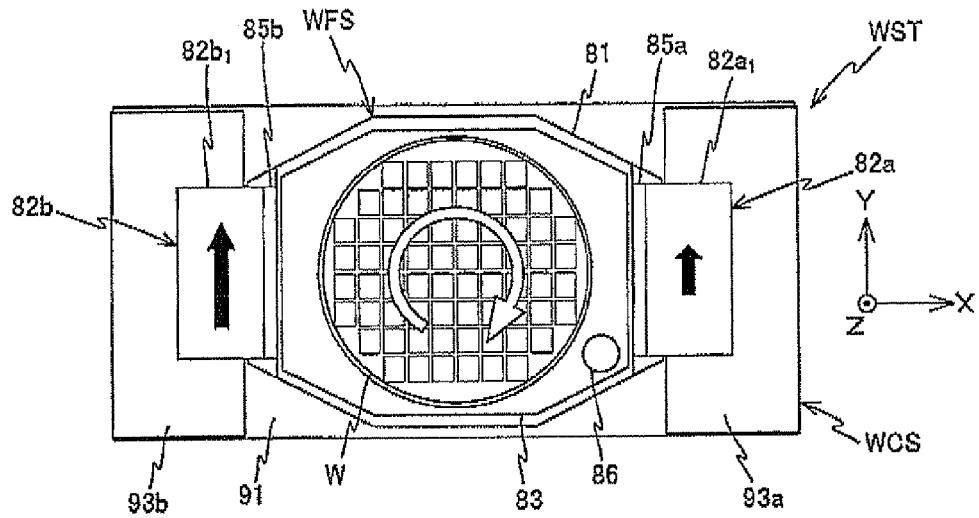
FIG. 5A is a view used to explain an operation when a fine movement stage is rotated around the Z-axis with respect to a coarse movement stage.

Further, as shown in FIG. 5A, for example, main controller 20 can make fine movement stage WFS rotate around the Z-axis (θz rotation) (refer to the outlined arrow in FIG. 5A), by applying a drive force (thrust) in the Y-axis direction having a different magnitude to both Mover section 82a on the +X side and mover section 82b on the −X side of fine movement stage WFS (refer to the black arrow in FIG. 5A). Incidentally, in contrast with FIG. 5A, by making the drive force applied to mover section 82a on the +X side larger than the −X side, fine movement stage WFS can be made to rotate counterclockwise with respect to the Z-axis.

Figure 5B:
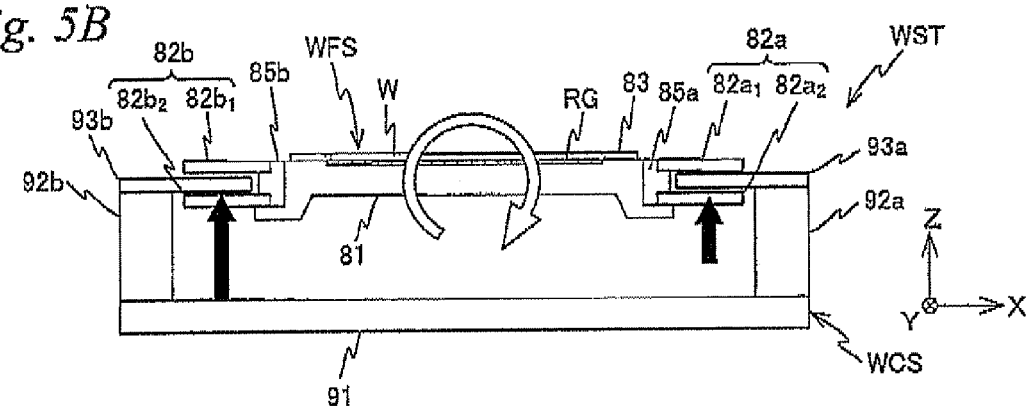
FIG. 5B is a view used to explain an operation when a fine movement stage is rotated around the Y-axis with respect to a coarse movement stage.

Further, as shown in FIG. 5B, main controller 20 can make fine movement stage WFS rotate around the Y-axis (θy drive) (refer to the outlined arrow in FIG. 5B), by applying a different levitation force (refer to the black arrows in FIG. 5B) to both mover section 82a on the +X side and mover section 82b on the −X side of fine movement stage WFS. Incidentally, in contrast with FIG. 5B, by making the levitation force applied to mover section 82a larger than the mover section 82b side, fine movement stage WFS can be made to rotate counterclockwise with respect to the Y-axis.

Figure 5C:
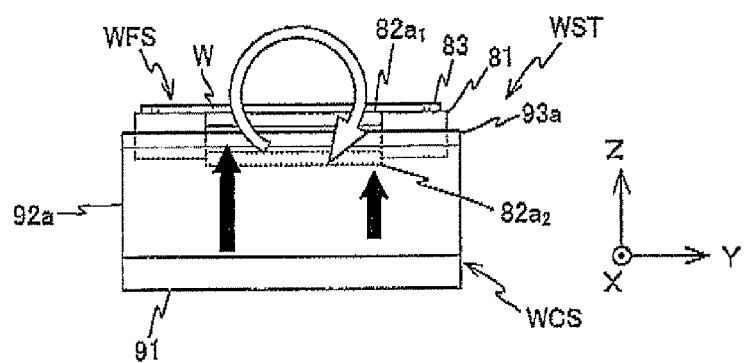
FIG. 5C is a view used to explain an operation when a fine movement stage is rotated around the X-axis with respect to a coarse movement stage.

Further, as shown in FIG. 5C, for example, main controller 20 can make fine movement stage WFS rotate around the X-axis (θx drive) (refer to the outlined arrow in FIG. 5C), by applying a different levitation force to both mover sections 82a and 82b of fine movement stage WFS on the + side and the − side in the Y-axis direction (refer to the black arrow in FIG. 5C). Incidentally, in contrast with FIG. 5C, by making the levitation force applied to mover section 82a (and 82b) on the −Y side smaller than the levitation force on the +Y side, fine movement stage WFS can be made to rotate counterclockwise with respect to the X-axis.

As it can be seen from the description above, in the embodiment, fine movement stage drive system 52 supports fine movement stage WFS by levitation in a non-contact state with respect to coarse movement stage WCS, and can also drive fine movement stage WFS in a non-contact manner in directions of six degrees of freedom (X, Y, Z, θx, θy, θz) with respect to coarse movement stage WCS.

Figure 6:
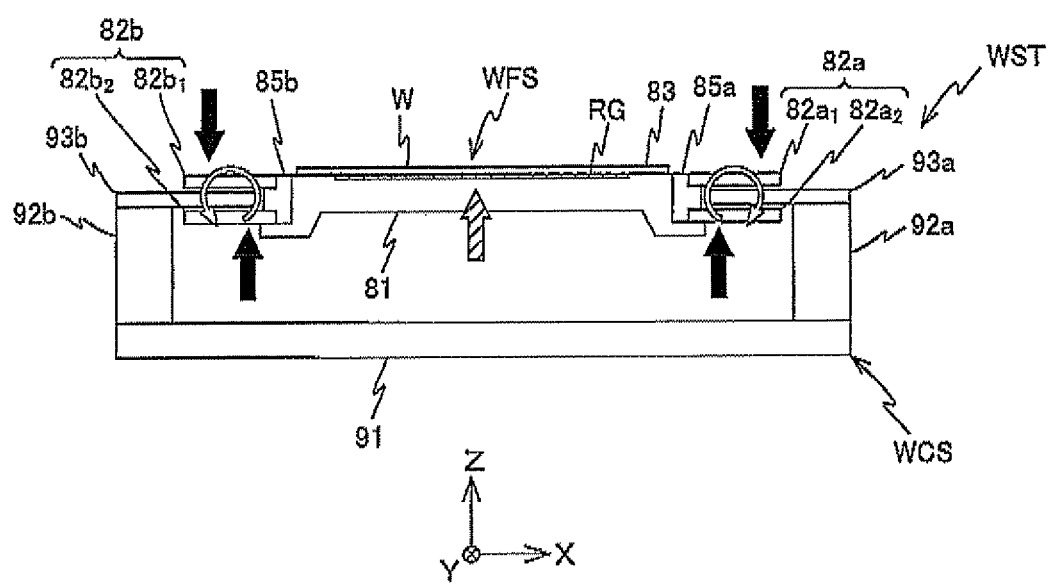
FIG. 6 is a view used to explain an operation when a center section of the fine movement stage is deflected in the +Z direction.

Further, in the embodiment, by supplying electric current to the two lines of coils 55 and 57 (refer to FIG. 4) placed inside stator section 93a in directions opposite to each other when applying the levitation force to fine movement stage WFS, for example, main controller 20 can apply a rotational force (refer to the outlined arrow in FIG. 6) around the Y-axis simultaneously with the levitation force (refer to the black arrow in FIG. 6) with respect to mover section 82a, as shown in FIG. 6. Similarly, by supplying electric current to the two lines of coils 55 and 57 placed inside stator section 93b in directions opposite to each other when applying the levitation force to fine movement stage WFS, for example, main controller 20 can apply a rotational force around the Y-axis simultaneously with the levitation force with respect to mover section 82a.

Further, by applying a rotational force around the Y-axis (a force in the θy direction) to each of the pair of mover sections 82a and 82b in directions opposite to each other, main controller 20 can deflect the center in the X-axis direction of fine movement stage WFS in the +Z direction or the −Z direction (refer to the hatched arrow in FIG. 6). Accordingly, as shown in FIG. 6, by bending the center in the X-axis direction of fine movement stage WFS in the +Z direction (in a convex shape), the deflection in the middle part of fine movement stage WFS (main body section 81) in the X-axis direction due to the self-weight of wafer W and main body section 81 can be canceled out, and degree of parallelization of the wafer W surface with respect to the XY plane (horizontal surface) can be secured. This is particularly effective, in the case such as when the diameter of wafer W becomes large and fine movement stage WFS also becomes large.

Further, when wafer W is deformed by its own weight and the like, there is a risk that the surface of wafer W mounted on fine movement stage WFS will no longer be within the range of the depth of focus of projection optical system PL within the irradiation area (exposure area IA) of illumination light IL. Therefore, similar to the case described above where main controller 20 deflects the center in the X-axis direction of fine movement stage WFS to the +Z direction, by applying a rotational force around the Y-axis to each of the pair of mover sections 82a and 82b in directions opposite to each other, wafer W is deformed to be substantially flat, and the surface of wafer W within exposure area IA can fall within the range of the depth of focus of projection optical system PL. Incidentally, while FIG. 6 shows an example where fine movement stage WFS is bent in the +Z direction (a convex shape), fine movement stage WFS can also be bent in a direction opposite to this (a concave shape) by controlling the direction of the electric current supplied to the coils.

Incidentally, the method of making fine movement stage WFS (and wafer W held by this stage) deform in a concave shape or a convex shape within a surface (XZ plane) perpendicular to the Y-axis can be applied, not only in the case of correcting deflection caused by its own weight and/or focus leveling control, but also in the case of employing a super-resolution technology which substantially increases the depth of focus by changing the position in the Z-axis direction at a predetermined point within the range of the depth of focus, while the predetermined point within the shot area of wafer W crosses exposure area IA, as is disclosed in, for example, U.S. Pat. RE 37391 and the like.

In exposure apparatus 100 of the embodiment, at the time of exposure operation by the step-and-scan method to wafer W, positional information (including the positional information in the θz direction) in the XY plane of fine movement stage WFS is measured by main controller 20 using an encoder system 73 (refer to FIG. 3) of fine movement stage position measurement system 70 which will be described later on. The positional information of fine movement stage WFS is sent to main controller 20, which controls the position of fine movement stage WFS based on the positional information.

On the other hand, when wafer stage WST (fine movement stage WFS) is outside the measurement area of fine movement stage position measurement system 70, the positional information of wafer stage WST is measured by main controller 20 using wafer stage position measurement system 16 (refer to FIG. 3). As shown in FIG. 1, wafer stage position measurement system 16 includes a laser interferometer which irradiates a measurement beam on a reflection surface formed on the coarse movement stage WCS side surface by mirror polishing and measures positional information of wafer stage WST in the XY plane. Incidentally, the positional information of wafer stage WST in the XY plane can be measured using other measurement devices, such as for example, an encoder system, instead of wafer stage position measurement system 16 described above. In this case, for example, a two-dimensional scale can be placed on the upper surface of base board 12, and an encoder head can be attached to the bottom surface of coarse movement stage WCS.

As shown in FIG. 1, fine movement stage position measurement system 70 is equipped with a measurement member (a measurement arm 71) which is inserted in a space inside coarse movement stage WCS in a state where wafer stage WST is placed below projection optical system PL. Measurement arm 71 is supported cantilevered (supported in the vicinity of one end) by main frame BD via a support section 72. Incidentally, in the case a configuration is employed where the measurement members do not interfere with the movement of the wafer stage, the configuration is not limited to the cantilever support, and both ends in the longitudinal direction can be supported.

Measurement arm 71 is a square column shaped (that is, a rectangular solid shape) member having a longitudinal rectangular cross section whose longitudinal direction is in the Y-axis direction and size in a height direction (the Z-axis direction) is larger than the size in a width direction (the X-axis direction), and is made of a material which is the same that transmits light, such as, for example, a glass member, which is affixed in plurals. Measurement arm 71 is formed solid, except for the portion where the encoder head (an optical system) which will be described later is housed. In the state where wafer stage WST is placed below projection optical system PL as previously described, the tip of measurement arm 71 is inserted into the space of coarse movement stage WCS, and its upper surface faces the lower surface (to be more precise, main body section 81 (not shown in FIG. 1, refer to FIG. 2A and the like) of fine movement stage WFS as shown in FIG. 1. The upper surface of measurement arm 71 is placed almost parallel with the lower surface of fine movement stage WFS, in a state where a predetermined clearance, such as, for example, around several mm, is formed with the lower surface of fine movement stage WFS. Incidentally, the clearance between the upper surface of measurement arm 71 and the lower surface of fine movement stage WFS can be more than or less than several mm.

As shown in FIG. 3, fine movement stage position measurement system 70 is equipped with encoder system 73 and laser interferometer system 75. Encoder system 73 includes an X linear encoder 73x measuring the position of fine movement stage WFS in the X-axis direction, and a pair of Y linear encoders 73ya and 73yb measuring the position of fine movement stage WFS in the Y-axis direction. In encoder system 73, a head of a diffraction interference type is used that has a configuration similar to an encoder head (hereinafter shortly referred to as a head) disclosed in, for example, U.S. Pat. No. 7,238,931, U.S. Patent Application Publication No. 2007/0288121 and the like. However, in the embodiment, a light source and a photodetection system (including a photodetector) of the head are placed external to measurement arm 71 as in the description later on, and only an optical system is placed inside measurement arm 71, or more specifically, facing grating RG. Hereinafter, the optical system placed inside measurement arm 71 will be referred to as a head, besides the case when specifying is especially necessary.

Figure 7A:
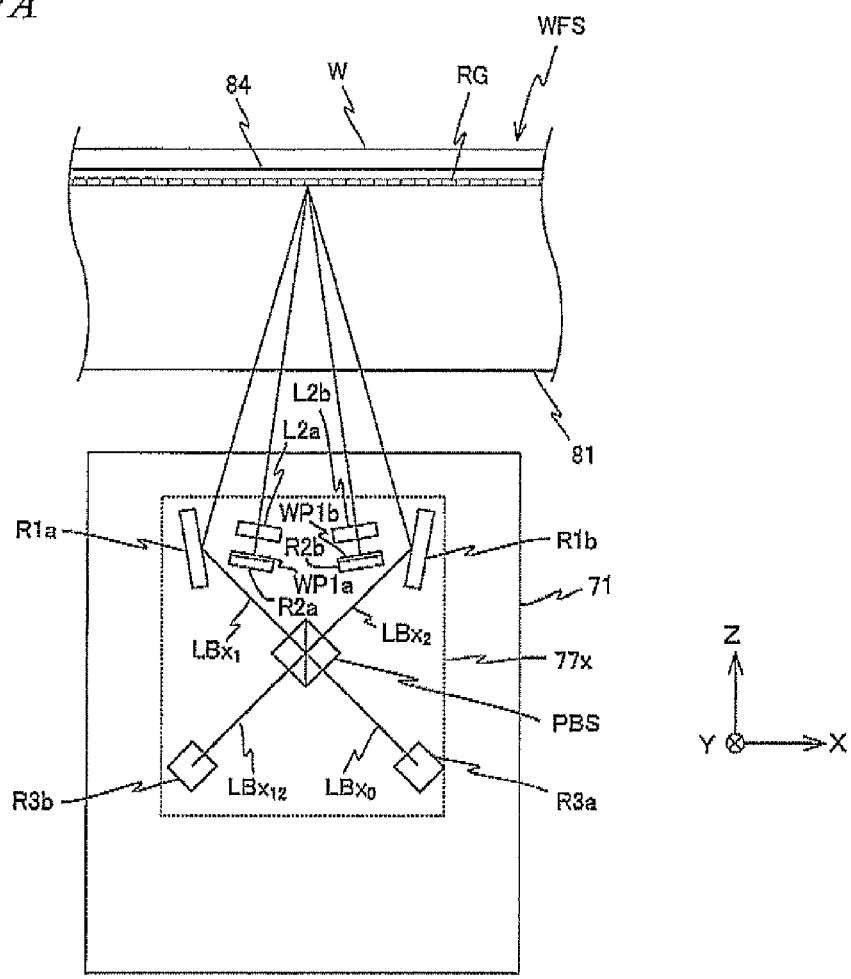
FIG. 7A is a view showing a rough configuration of an X head 77x.
Figure 7B:
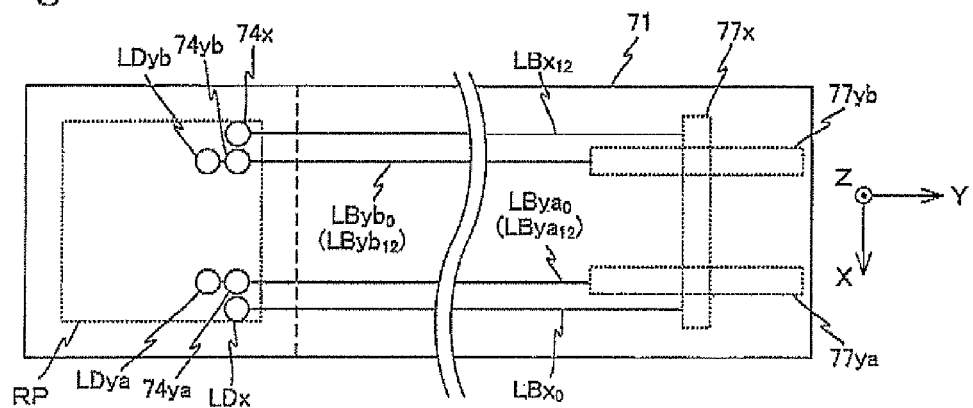
FIG. 7B is a view used to explain a placement of each of the X head 77x, Y heads 77ya and 77yb inside the measurement arm.

Encoder system 73 measures the position of fine movement stage WFS in the X-axis direction using one X head 77x (refer to FIGS. 7A and 7B), and the position in the Y-axis direction using a pair of Y heads 77ya and 77yb (refer to FIG. 7B). More specifically, X linear encoder 73x previously described is configured by X head 77x which measures the position of fine movement stage WFS in the X-axis direction using an X diffraction grating of grating RG, and the pair of Y linear encoders 73ya and 73yb is configured by the pair of Y heads 77ya and 77yb which measures the position of fine movement stage WFS in the Y-axis direction using a. Y diffraction grating of grating RG.

A configuration of three heads 77x, 77ya, and 77yb which configure encoder system 73 will now be described. FIG. 7A representatively shows a rough configuration of X head 77x, which represents three heads 77x, 77ya, and 77yb. Further, FIG. 7B shows a placement of each of the X head 77x, and Y heads 77ya and 77yb within measurement arm 71.

As shown in FIG. 7A, X head 77x is equipped with a polarization beam splitter PBS whose separation plane is parallel to the YZ plane, a pair of reflection mirrors R1a and R1b, lenses L2a and L2b, quarter wavelength plates (hereinafter, described as λ/4 plates) WP1a and WP1b, reflection mirrors R2a and R2b, and reflection mirrors R1a and R3b and the like, and these optical elements are placed in a predetermined positional relation. Y heads 77ya and 77yb also have an optical system with a similar structure. As shown in FIGS. 7A and 7B, X head 77x, Y heads 77ya and 77yb are each unitized and fixed inside of measurement arm 71A.

As shown in FIG. 7B, in X head 77x (X encoder 73x), a laser beam $LBx_0$ is emitted in the −Z direction from a light source LDx provided on the upper surface (or above) at the end on the −Y side of measurement arm 71, and its optical path is bent to become parallel with the Y-axis direction via a reflection surface RP which is provided on a part of measurement arm 71 inclined at an angle of 45 degrees with respect to the XY plane. This laser beam $LBx_0$ travels through the solid section inside measurement arm 71 in parallel with the longitudinal direction (the Y-axis direction) of measurement arm 71, and reaches reflection mirror R3a (refer to FIG. 7A) Then, the optical path of laser beam $LBx_0$ is bent by reflection mirror R3a and is incident on polarization beam splitter PBS. Laser beam $LBx_0$ is split by polarization by polarization beam splitter PBS into two measurement beams $LBx_1$ and $LBx_2$. Measurement beam $LBx_1$ having been transmitted through polarization beam splitter PBS reaches grating RG formed on fine movement stage WFS, via reflection mirror R1a, and measurement beam $LBx_2$ reflected off polarization beam splitter PBS reaches grating RG via reflection mirror R1b. Incidentally, "split by polarization" in this case means the splitting of an incident beam into a P-polarization component and an S-polarization component.

Predetermined-order diffraction beams that are generated from grating RG due to irradiation of measurement beams $LBx_1$ and $LBx_2$, such as, for example, the first-order diffraction beams are severally converted into a circular polarized light by λ/4 plates WP1a and WP1b via lenses L2a and L2b, and reflected by reflection mirrors R2a and R2b and then the beams pass through λ/4 plates WP1a and WP1b again and reach polarization beam splitter PBS by tracing the same optical path in the reversed direction.

Each of the polarization directions of the two first-order diffraction beams that have reached polarization beam splitter PBS is rotated at an angle of 90 degrees with respect to the original direction. Therefore, the first-order diffraction beam of measurement beam $LBx_2$ having passed through polarization beam splitter PBS first, is reflected off polarization beam splitter PBS. The first-order diffraction beam of measurement beam $LBx_2$ having been reflected off polarization beam splitter PBS first, passes through polarization beam splitter PBS. This coaxially synthesizes the first-order diffraction beams of each of the measurement beams $LBx_1$ and $LBx_2$ as a synthetic beam $LBx_{12}$. Synthetic beam $LBx_{12}$ has its optical path bent by reflecting mirror R3b so it becomes parallel to the Y-axis, travels inside measurement arm 71 parallel to the Y-axis, and then is sent to an X photodetection system 74x provided on the upper surface (or above) at the end on the Y side of measurement arm 71 shown in FIG. 7B via reflection surface RP previously described.

In X photodetection system 74x, the polarization direction of the first-order diffraction beams of beams LBx and $LBx_2$ synthesized as synthetic beam $LBx_{12}$ is arranged by a polarizer (analyzer) (not shown) and the beams overlay each other so as to form an interference light, which is detected by the photodetector and is converted into an electric signal in accordance with the intensity of the interference light. When fine movement stage WFS moves in the measurement direction (in this case, the X-axis direction) here, a phase difference between the two beams changes, which changes the intensity of the interference light. This change in the intensity of the interference light is supplied to main controller 20 (refer to FIG. 3) as positional information related to the X-axis direction of fine movement stage WFS.

As shown in FIG. 7B, laser beams $LBya_0$ and $LByb_0$, which are emitted from light sources LDya and LDyb, respectively, and whose optical paths are bent by an angle of 90 degrees so as to become parallel to the Y-axis by reflection surface RP1 previously described, are incident on Y heads 77ya and 77yb, and similar to the previous description, from Y heads 77ya and 77yb, synthetic beams $LBya_{12}$ and $LByb_{12}$ of the first-order diffraction beams by grating RG (Y diffraction grating) of each of the measurement beams split by polarization by the polarization beam splitter are output, respectively, and are returned to Y photodetection system 74ya, 74yb. Now, laser beams $LBya_0$ and $LByb_0$ emitted from light sources LDya and LDyb, and synthetic beams $LBya_{12}$ and $LByb_{12}$ returning to Y photodetection systems 74ya and 74yb, each pass an optical path which are overlaid in a direction perpendicular to the page surface of FIG. 7B. Further, as described above, in Y heads 77ya and 77yb, optical paths are appropriately bent (omitted in drawings) inside so that laser beams $LBya_0$ and $LByb_0$ emitted from the light source and synthetic beams $LBya_{12}$ and $LByb_{12}$ returning to Y photodetection systems 74ya and 74yb pass optical paths which are parallel and distanced apart in the Z-axis direction.

Figure 8A:
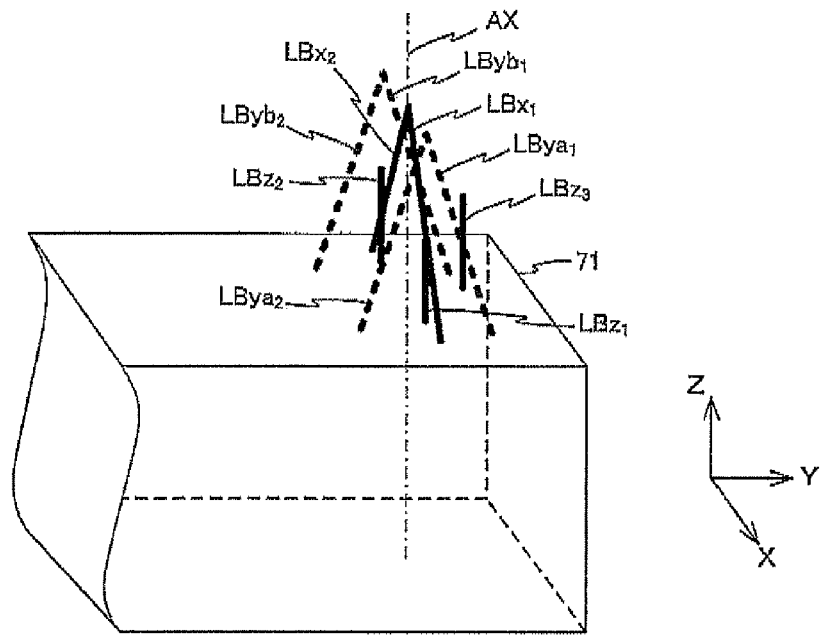
FIG. 8A shows a perspective view of a tip of a measurement arm.
Figure 8B:
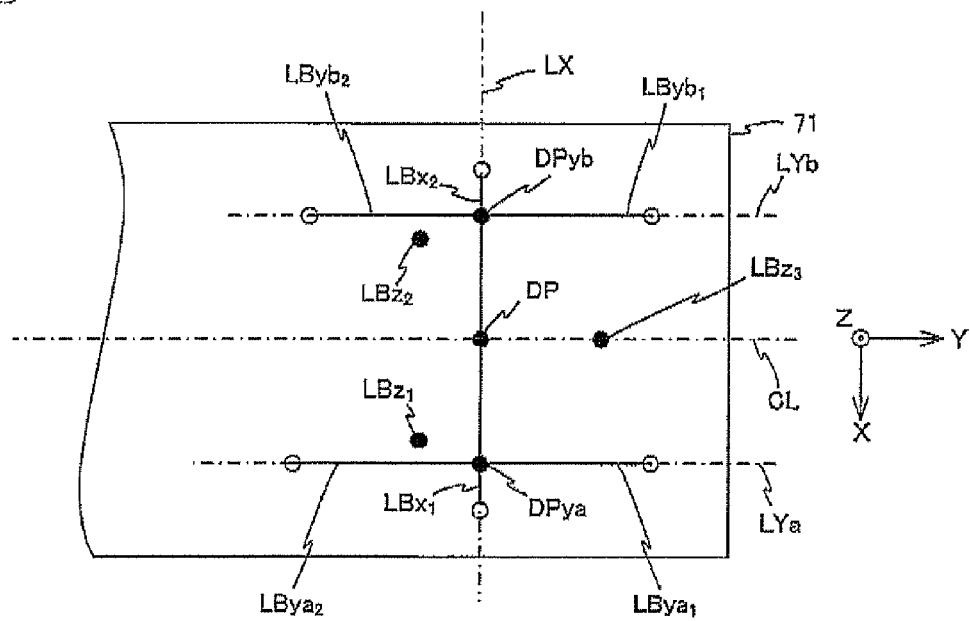
FIG. 8B is a planar view when viewed from the +Z direction of an upper surface of the tip of the measurement arm.

FIG. 8A shows a tip of measurement arm 71 in a perspective view, and FIG. 8B shows an upper surface of the tip of measurement arm 71 in a planar view when viewed from the +Z direction. As shown in FIGS. 8A and 8B, X head 77x irradiates measurement beams $LBx_1$ and $LBx_2$ (indicated by a solid line in FIG. 8A) from two points (refer to the white circles in FIG. 8B) on a straight line LX parallel to the X-axis that are at an equal distance from a center line CL of measurement arm 71, on the same irradiation point on grating RG (refer to FIG. 7A). The irradiation point of measurement beams $LBx_1$ and $LBx_2$, that is a detection point of X head 77x (refer to reference code DP in FIG. 8B) coincides with the exposure position which is the center of irradiation area (exposure area) IA of illumination light IL irradiated on wafer W (refer to FIG. 1). Incidentally, while measurement beams $LBx_1$ and $LBx_2$ are actually refracted at a boundary and the like of main body section 81 and an atmospheric layer, it is shown simplified in FIG. 7A and the like.

As shown in FIG. 7B, each of the pair of Y heads 77ya and 77yb are placed on the +X side and the −X side of center line CL. As shown in FIGS. 8A and 8B, Y head 77ya irradiates measurement beams $LBya_1$ and $LBya_2$ that are each shown by a broken line in FIG. 8A on a common irradiation point on grating RG from two points (refer to the white circles in FIG. 8B) which are distanced equally from straight line LX on a straight line LYa which is parallel to the Y-axis. The irradiation point of measurement beams $LBya_1$ and $LBya_2$, that is, a detection point of Y head 77ya is shown by reference code DPya in FIG. 8B.

Y head 77yb irradiates measurement beams $LByb_1$ and $LByb_2$ from two points (refer to the white circles in FIG. 8B) which are symmetrical to the two outgoing points of measurement beams $LBya_1$, and $LBya_2$ with respect to center line CL, on a common irradiation point DPyb on grating RG. As shown in FIG. 8B, detection points DPya and DPyb of Y heads 77ya and 77yb, respectively, are placed on straight line LX which is parallel to the X-axis.

Now, main controller 20 determines the position of fine movement stage WFS in the Y-axis direction, based on an average of the measurement values of the two Y heads 77ya and 77yb. Accordingly, in the embodiment, the position of fine movement stage WFS in the Y-axis direction is measured with a midpoint DP of detection points DPya and DPyb serving as a substantial measurement point. Midpoint DP coincides with the irradiation point of measurement beams $LBx_1$ and $LBx_2$ on grating RG.

More specifically, in the embodiment, there is a common detection point regarding measurement of positional information of fine movement stage WFS in the X-axis direction and the Y-axis direction, and this detection point coincides with the exposure position, which is the center of irradiation area (exposure area) IA of illumination light IL irradiated on wafer W. Accordingly, in the embodiment, by using encoder system 73, main controller 20 can constantly perform measurement of the positional information of fine movement stage WFS in the XY plane, directly under (at the rear side of fine movement stage WFS) the exposure position when transferring a pattern of reticle R on a predetermined shot area of wafer W mounted on fine movement stage WFS. Further, main controller 20 measures a rotational amount of fine movement stage WFS in the θz direction, based on a difference of the measurement values of the pair of Y heads 77ya and 77yb.

As shown in FIG. 8A, laser interferometer system 75 makes three measurement beams $LBz_1$, $LBz_2$, and $LBz_3$ enter the lower surface of fine movement stage WFS from the tip of measurement arm 71. Laser interferometer system 75 is equipped with three laser interferometers 75a to 75c (refer to FIG. 3) that irradiate three measurement beams $LBz_1$, $LBz_2$, and $LBz_3$, respectively.

In laser interferometer system 75, three measurement beams $LBz_1$, $LBz_2$, and $LBz_3$ are emitted in parallel with the Z-axis from each of the three points that are not collinear on the upper surface of measurement arm 71, as shown in FIGS. 8A and 8B. Now, as shown in FIG. 8B, three measurement beams $LBz_1$, $LBz_2$, and $LBz_3$ are each irradiated from three points corresponding to the apexes of an isosceles triangle (or an equilateral triangle) whose centroid coincides with the exposure area which is the center of irradiation area (exposure area) IA. In this case, the outgoing point (irradiation point) of measurement beam $LBz_3$ is located on center line CL, and the outgoing points (irradiation points) of the remaining measurement beams $LBz_1$ and $LBz_2$ are equidistant from canter line CL. In the embodiment, main controller 20 measures the position in the Z-axis direction, the rotational amount in the θx direction and the θy direction of fine movement stage WFS, using laser interferometer system 75. Incidentally, laser interferometers 75a to 75c are provided on the upper surface (or above) at the end on the −Y side of measurement arm 71. Measurement beams $LBz_1$, $LBz_2$, and $LBz_3$ emitted in the −Z direction from laser interferometers 75a to 75c travel within measurement arm 71 along the Y-axis direction via reflection surface RP previously described, and each of their optical paths is bent so that the beams are emitted from the three points described above.

In the embodiment, on the lower surface of fine movement stage WFS, a wavelength selection filter (omitted in drawings) which transmits each measurement beam from encoder system 73 and blocks the transmission of each measurement beam from laser interferometer system 75 is provided. In this case, the wavelength selection filter also serves as a reflection surface of each of the measurement beams from laser interferometer system 75. As the wavelength selection filter, a thin film and the like having wavelength-selectivity is used, and in the embodiment, the wavelength selection filter is provided, for example, on one surface of the transparent plate (main body section 81), and grating RG is placed on the wafer holder side with respect to the one surface.

As it can be seen from the description so far, main controller 20 can measure the position of fine movement stage WFS in directions of six degrees of freedom by using encoder system 73 and laser interferometer system 75 of fine movement stage position measurement system 70. In this case, since the optical path lengths of the measurement beams are extremely short and also are almost equal to each other in encoder system 73, the influence of air fluctuation can mostly be ignored. Accordingly, by encoder system 73, positional information of fine movement stage WFS within the XY plane (including the θz direction) can be measured with high accuracy. Further, because the substantial detection points on the grating in the X-axis direction and the Y-axis direction by encoder system 73 and detection points on the lower surface of fine movement stage WFS in the Z-axis direction by laser interferometer system 75 coincide with the center (exposure position) of exposure area IA within the XY plane, respectively, generation of the so-called Abbe error caused by a shift within the XY plane of the detection point and the exposure position is suppressed to a substantially ignorable degree. Accordingly, by using fine movement stage position measurement system 70, main controller 20 can measure the position of fine movement stage WFS in the X-axis direction, the Y-axis direction, and the Z-axis direction with high precision, without any Abbe errors caused by a shift within the XY plane of the detection point and the exposure position.

However, as for the Z-axis direction parallel to the optical axis of projection optical system PL, positional information in the XY plane of fine movement stage WFS is not necessarily measured by encoder system 73 at a position at the surface of wafer W, or in other words, the Z position of the placement surface of grating RG and the surface of wafer W do not necessarily coincide. Accordingly, in the case grating RG (in other words, fine movement stage WFS) is inclined with respect to the XY plane, when fine movement stage WFS is positioned based on measurement values of each encoder of encoder system 73, a positioning error (a kind of Abbe error) which corresponds to a tilt of grating RG with respect to the XY plane occurs as a consequence, caused by a difference ΔZ (in other words, a positional shift in the Z-axis direction of the detection point by encoder system 73 and the exposure position) of the Z position between the placement surface of grating RG and the surface of wafer W. However, this positioning error (a position control error) can be obtained by a simple calculation using difference ΔZ, pitching amount θx, and rolling amount θy, and by using these as offsets and performing position control of fine movement stage WFS based on positional information after correction where measurement values of (each of the encoders of) encoder system 73 have been corrected by the offsets, fine movement stage WFS will not be influenced by the kind of Abbe error described above.

Figure 9:
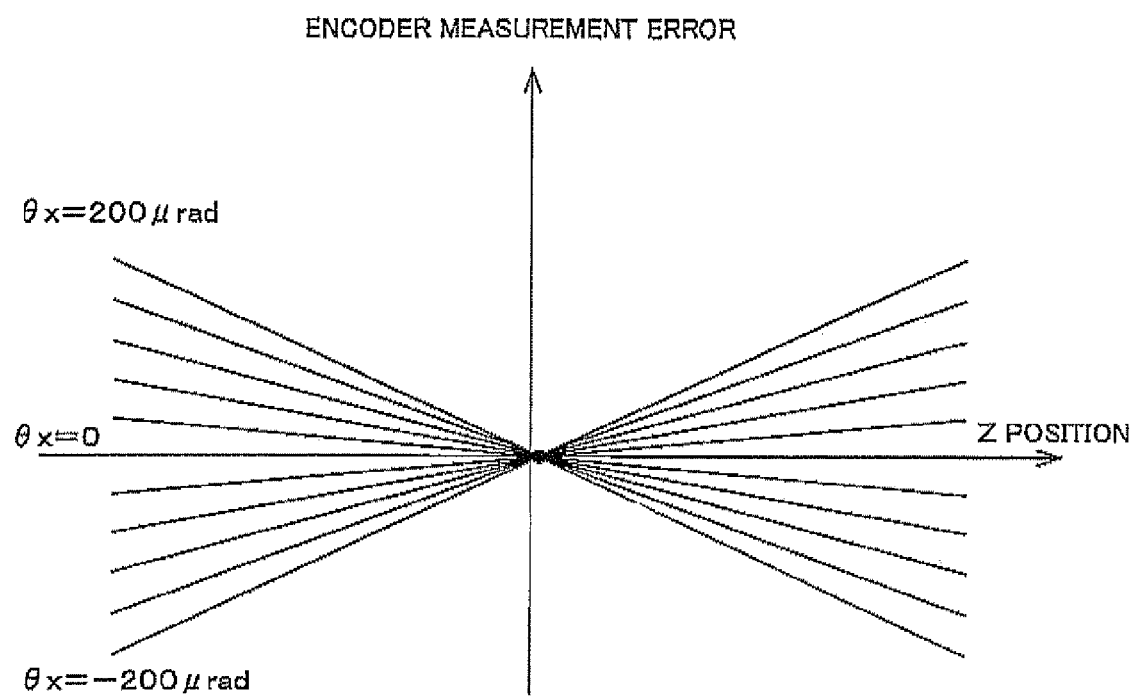
FIG. 9 is a graph showing a measurement error of an encoder with respect to a Z position of the fine movement stage in pitching amount θx.

Further, in the configuration of encoder system 73 of the embodiment, measurement errors due to displacement in a direction besides a measurement direction of grating RG (in other words, fine movement stage WFS), particularly, in inclined (θx, θy) and rotational (θz) directions, may occur. Therefore, main controller 20 makes a correction information to correct the measurement errors. Now, as an example, a making method of correction information to correct measurement errors of X encoder 73x will be explained. Incidentally, in the configuration of encoder system 73 of the embodiment, measurement errors due to displacement in the X, Y, and Z directions of fine movement stage WFS shall not occur.

a. Main controller 20, first of all, controls coarse movement stage drive system 51 while monitoring the positional information of wafer stage WST using wafer stage position measurement system 16, and drives fine movement stage WFS along with coarse movement stage WCS into a measurement area of X encoder 73x.

b. Next, main controller 20 controls fine movement stage drive system 52 based on measurement results of laser interferometer system 75 and Y encoders 73ya and yb, and fixes fine movement stage WFS so that roiling amount θy and yawing amount θz are both zero, and pitching θx is a predetermined amount (e.g., 200 μrad).

c. Next, main controller 20 controls fine movement stage drive system 52 based on the measurement results of laser interferometer system 75 and Y encoders 73ya and yb, and drives fine movement stage WFS in the Z-axis direction within a predetermined range, such as for example, −100 μm to +100 μm, while maintaining the attitude (pitching amount θx, rolling amount θy=0, yawing amount θz=0) of fine movement stage WFS described above, so as to measure positional information in the X-axis direction of fine movement stage WFS, using X encoder 73x.

d. Next, main controller 20 controls fine movement stage drive system 52 based on the measurement results of laser interferometer system 75 and Y encoders 73ya and yb, and changes pitching amount θx in a predetermined range, such as for example, −200 μm to +200 μm, while keeping rolling amount θy and yawing amount θz of fine movement stage WFS fixed. Now, pitching amount θx shall be changed by a predetermined pitch Δθx. Then, a processing similar to c. is to be carried out for each pitching amount θx.

e. By the processing b. to d. described above, measurement results of X encoder 73x to θx and Z when θy=θz=0 can be obtained. The measurement results are plotted, with the Z position of fine movement stage WFS on the horizontal axis and measurement values of X encoder 73x on the vertical axis, and these relations plotted versus each pitching amount θx, as shown in FIG. 9. This allows a plurality of straight lines having different slopes to be obtained by joining the plotted points for each pitching amount θx, and an intersecting point of these straight lines show a true measurement value of X encoder 73x. Therefore, by choosing the intersecting point as an origin, the vertical axis can be read as a measurement error of X encoder 73x. Now, the Z position at the origin shall be $Z_{x0}$. The measurement errors obtained by the processing described above of X encoder 73x with respect to θx and Z when θy=θz=0, serves as a θx correction information.

f. Similar to the processing b. to d. described above, main controller 20 fixes both pitching amount θx and yawing amount θz of fine movement stage WFS to zero, and changes rolling amount θy of fine movement stage WFS. And, for each θy, fine movement stage WFS is driven in the Z-axis direction and positional information in the X-axis direction of fine movement stage WFS is measured using X encoder 73x. Using results which are obtained, a relation between a Z position of fine movement stage WFS with respect to each θy when θx=θz=0 and measurement values of X encoder 73x are plotted, similar to FIG. 9. Furthermore, an intersecting point of a plurality of straight lines having different slopes which can be obtained by joining the plotted points for each rolling amount θy is chosen, or in other words, a measurement value of X encoder 73x corresponding to the intersecting point serves as a true measurement value, and the shift from the true measurement value is to be a measurement error. Now, the Z position at the origin shall be zy0. The measurement errors obtained by the processing described above of X encoder 73x with respect to θy and Z when θx=θz=0, serves as a θy correction information.

g. Similar to the processing b. to d. and f., main controller 20 obtains the measurement error of X encoder 73x with respect to θz and Z when θx=θy=0. Incidentally, the Z position at the origin shall be zz0 as in the previous description. The measurement errors obtained by such processing serve as a θz correction information.

Incidentally, the θx correction information can be stored in memory, in a table data format consisting of discrete measurement errors of an encoder at each measurement point of pitching amount θx and the Z position, or in a form of a trial function of pitching amount θx and the Z position which indicates a measurement error of the encoder. In the latter case, an undetermined coefficient of the trial function is to be determined, for example, by the least-squares method using the measurement error of the encoder. The same can be said for the θy correction information and the θz correction information.

Incidentally, the measurement error of the encoder generally depends on all of pitching amount θx, rolling amount θy, and yawing amount θz. However, it is known that the degree of dependence is small. Accordingly, it can be regarded that the measurement error of the encoder due to the attitude change of grating RG depend on each of θx, θy and θz, independently. In other words, the measurement error (all measurement errors) of the encoder due to the attitude change of grating RG can be given, for example, in the form of formula (1) below, in a linear sum of the measurement error with respect to each of θx; θy, and θz.

$$\Delta x = \Delta x(Z, \theta x, \theta y, \theta z)$$
$$= \theta x (z - z_{x0}) + \theta y (z - z_{y0}) + \theta z (z - z_{z0}) \quad (1)$$

Main controller 20 makes correction information θx Correction information, θy correction information, θz correction information) to correct the measurement errors of Y encoders 73a and 73yb, according to a procedure similar to the making procedure of the correction information described above. All measurement errors Δy=Δy (Z, θx, θy, θz) can be given in a similar form as in formula (1) above.

Main controller 20 performs the processing described above, such as at the time of start-up of exposure apparatus 100, during an idle state, or at the time of wafer exchange of a predetermined number, as in, for example, a number of units, and makes the correction information θx correction information, θy correction information, θz correction information) of Y encoders 73a and 73yb described above. Then, main controller 20 monitors the θx, θy, θz, and Z positions of fine movement stage WFS while exposure apparatus 100 is operating, and by using these measurement results, obtains error correction amount Δx and Δy of X encoder 73x, and Y encoders 73ya and 73yb from the correction information θx correction information, θy correction information, θz correction information).

Then, by main controller 20 further correcting the measurement errors of the measurement values after correction, which are the measurement values of X encoder 73x, and Y encoders 73ya and 73yb that have been corrected by the offset previously described, using error correction amount and Δy, measurement errors of encoder system 73 which occur due to the displacement of fine movement stage WFS to a tilt (θx, θy) and rotational (θz) directions are corrected. Or, a target position of fine movement stage WFS can be corrected, using such error correction amount and offset. In this approach as well, a similar effect can be obtained as in the case of correcting the measurement errors of encoder system 73. Incidentally, the measurement values of X encoder 73x, and Y encoders 73ya and 73yb can further be corrected by the offset previously described, after the correction using the error correction amount, or the measurement values of X encoder 73x, and Y encoders 73ya and 73yb can be corrected, simultaneously using the error correction amount and the offset.

In exposure apparatus 100 of the embodiment which it is configured in the manner described above, on manufacturing a device, first of all, main controller 20 detects the second fiducial marks on measurement plate 86 of fine movement stage WFS, using wafer alignment system ALG. Subsequently, main controller 20 performs wafer alignment (Enhanced Global Alignment (EGA) and the like which is disclosed in, for example, U.S. Pat. No. 4,780,617 and the like) and the like using wafer alignment system ALG. Incidentally, in exposure apparatus 100 of the embodiment, because wafer alignment system ALG is placed away in the Y-axis direction from projection unit PU, position measurement of fine movement stage WFS by the encoder system (measurement arm) of fine movement stage position measurement system 70 cannot be performed when, performing the wafer alignment. Therefore, wafer alignment is to be performed, while measuring the position of wafer W (fine movement stage WFS) via a laser interferometer system (not shown) similar to wafer stage position measurement system 16 previously described. Further, because wafer alignment system ALG and projection unit PU are distanced, main controller 20 converts array coordinates of each shot area on wafer W acquired from the wafer alignment into array coordinates which are based on the second fiducial marks.

Then, prior to the beginning of exposure, main controller 20 performs reticle alignment in a procedure (a procedure disclosed in, for example, U.S. Pat. No. 5,646,413 and the like) similar to a normal scanning stepper, using the pair of reticle alignment systems $RA_1$ and $RA_2$ previously described, and the pair of first fiducial marks on measurement plate 86 of fine movement stage WFS and the like. Then, main controller 20 performs exposure operation by the step-and-scan method, based on results of the reticle alignment and the results of the wafer alignment (array coordinates which uses the second fiducial marks of each of the shot areas on wafer W), and transfers the pattern of reticle R on each of the plurality of shot areas on wafer W. This exposure operation is performed by alternately repeating a scanning exposure operation where synchronous movement of reticle stage RST and wafer stage WST previously described is performed, and a movement (stepping) operation between shots where wafer stage WST is moved to an acceleration starting position for exposure of the shot area. In this case, scanning exposure by the liquid immersion exposure is performed. In exposure apparatus 100 of the embodiment, during the series of exposure operations, main controller 20 measures a position of fine movement stage WFS (wafer W) using fine movement stage position measurement system 70, and the measurement values of each encoder of encoder system 73 is corrected as described above, and the position of wafer W in the XY plane is controlled, based on the measurement values of each encoder of encoder system 73 after the correction. Further, the focus leveling control of wafer W during exposure is performed, based on the measurement results of multipoint AF system AF by main controller 20 as is previously described.

Figure 10A:
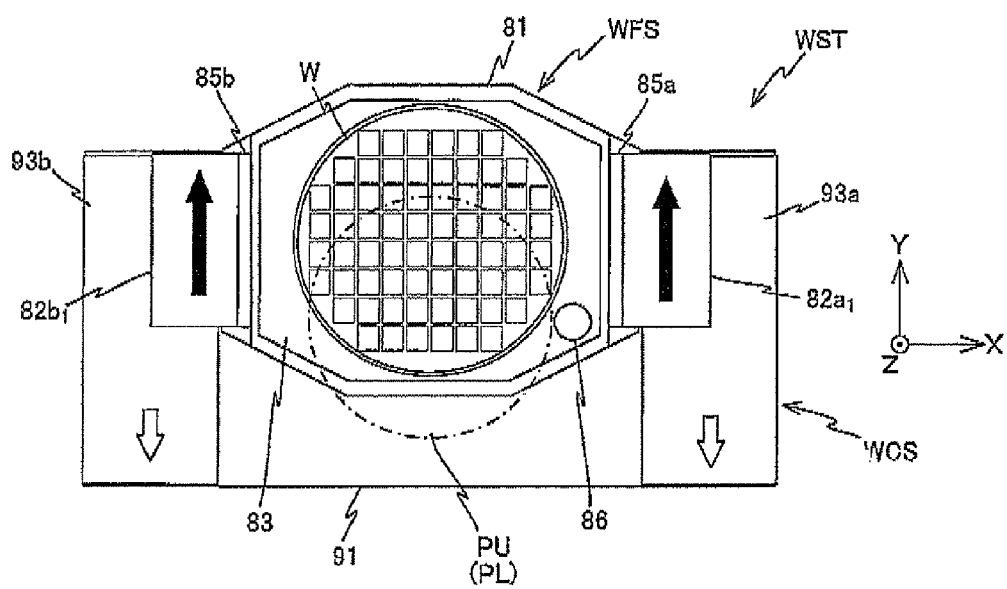
FIG. 10A is a view used to explain a drive method of a wafer at the time of scanning exposure.

Incidentally, while wafer W has to be scanned with high acceleration in the Y-axis direction at the time of scanning exposure operation described above, in exposure apparatus 100 of the embodiment, main controller 20 scans wafer W in the Y-axis direction by driving (refer to the black arrow in FIG. 10A) only fine movement stage WFS in the Y-axis direction (and in directions of the other five degrees of freedom, if necessary), without driving coarse movement stage WCS in principle at the time of scanning exposure operation as shown in FIG. 10A. This is because when moving only fine movement stage WFS, weight of the drive object is lighter when comparing with the case where coarse movement stage WCS is driven, which allows an advantage of being able to drive wafer W with high acceleration. Further, because position measuring accuracy of fine movement stage position measurement system 70 is higher than wafer stage position measurement system 16 as previously described, it is advantageous to drive fine movement stage WFS at the time of scanning exposure. Incidentally, at the time of this scanning exposure, coarse movement stage WCS is driven to the opposite side of fine movement stage WFS by an operation of a reaction force (refer to the outlined arrow in FIG. 10A) by the drive of fine movement stage WFS. More specifically, because coarse movement stage WCS functions as a countermass, momentum of the system consisting of the entire wafer stage WST is conserved and centroid shift does not occur, inconveniences such as unbalanced load acting on base board 12 by the scanning drive of fine movement stage WFS do not occur.

Figure 10B:
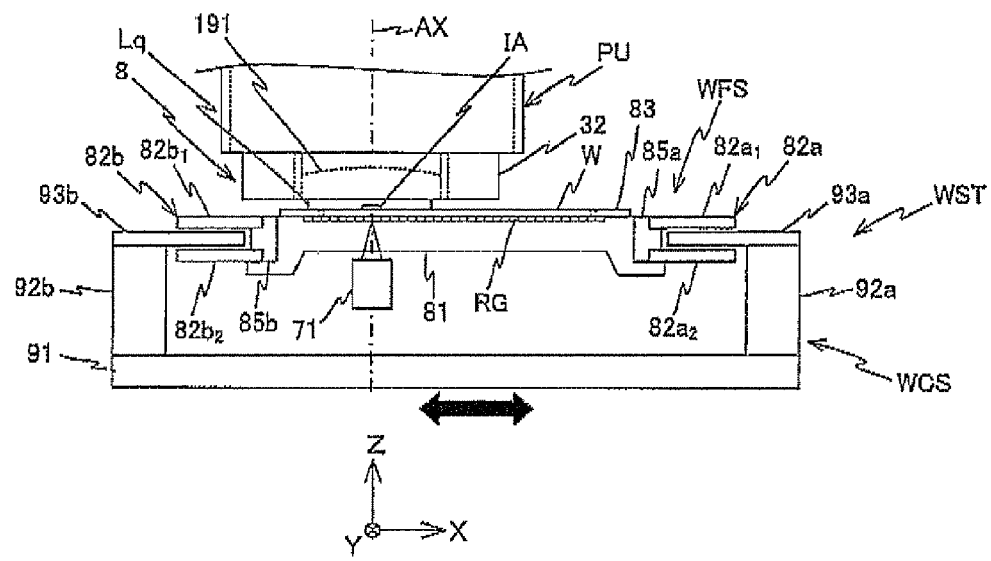
FIG. 10B is a view used to explain a driving method of a wafer at the time of stepping.

Meanwhile, when movement (stepping) between shots in the X-axis direction is performed, because movement capacity in the X-axis direction of fine movement stage WFS is small, main controller 20 moves wafer W in the X-axis direction by driving coarse movement stage WCS in the X-axis direction as shown in FIG. 10B.

As described above, according to exposure apparatus 100 of the embodiment, the positional information of fine movement stage WFS in the n plane is measured by main controller 20, using encoder system 73 of fine movement stage position measurement system 70 having measurement arm 71 previously described. In this case, because each of the heads of fine movement stage position measurement system 70 are placed in the space within coarse movement stage WCs, there is only space between fine movement stage WFS and the heads. Accordingly, each of the heads can be placed close to fine movement stage WFS (grating RG), which allows measurement of the positional information of fine movement stage WFS by fine movement stage position measurement system 70 with high precision, which in its turn allows a highly precise drive of fine movement stage WFS via fine movement stage drive system 52 (and coarse movement stage drive system 51) by main controller 20. Further, in this case, irradiation points of the measurement beams of each of the heads of encoder system 73 and laser interferometer system 75 configuring fine movement stage position measurement system 70 emitted from measurement arm 71 on grating RG coincide with the center (exposure position) of irradiation area (exposure area) IA of exposure light IL irradiated on wafer W. While the irradiation point of all the measurement beams does not always coincide with the exposure center here, the extent of the influence of the Abbe error is suppressible, or negligible. Accordingly, main controller 20 can measure the positional information of fine movement stage WFS with high accuracy, without being affected by so-called Abbe error which occurs due to a displacement between the detection point and the exposure position within the XY plane.

Further, by using difference $\Delta Z$ of the Z position between the placement surface of grating RG and the surface of wafer W, and angle of inclination $\theta x$ and $\theta y$ of grating RG more specifically, fine movement stage WFS), main controller 20 obtains the positioning error (position control error, a kind of Abbe error) corresponding to the tilt of grating RG with respect to the XY plane caused due to difference $\Delta Z$, and uses this as an offset, to correct the measurement values of (each encoder) of encoder system 73 by the offset. Furthermore, main controller 20 obtains error correction amount $\theta x$ and $\theta y$ of X encoder 73$x$, and Y encoders 73$ya$ and 73$yb$ from the correction information ($\theta x$ correction information, $\theta y$ correction information, $\theta z$ correction information), and further corrects the measurement values of X encoder 73$x$, and Y encoders 73$ya$ and 73$yb$. Accordingly, positional information of fine movement stage WFS can be measured with high precision by encoder system 73. Further, because optical path lengths in the atmosphere of the measurement beams of each of the heads of encoder system 73 can be made extremely short by placing measurement arm 71 right under grating RG, the influence of air fluctuation is reduced, and also in this point, the positional information of fine movement stage WFS can be measured with high accuracy.

Further, according to exposure apparatus 100 of the embodiment, main controller 20 can drive fine movement stage WFS with good precision, based on highly precise measurement results of positional information of fine movement stage WFS. Accordingly, main controller 20 can drive wafer W mounted on fine movement stage WFS in sync with reticle stage RST (reticle R) with good precision, and can transfer a pattern of reticle R on wafer W with good precision by scanning exposure.

Incidentally, in the embodiment above, the case has been described where main controller 20 corrects measurement errors in the direction besides the measurement direction of grating RG (More specifically, fine movement stage WFS) especially measurement errors occurring due to the displacement in tilt ($\theta x$, $\theta y$) and rotational ($\theta z$) directions, along with positioning errors (position control errors, a kind of Abbe error) corresponding to the tilt of grating RG with respect to the XY plane caused due to difference $\Delta Z$ that are included in the measurement values of each encoder of encoder system 73 on exposure. However, because the measurement errors in the latter case are usually small in comparison with the measurement errors in the former case, correction only on the measurement errors in the former case is acceptable.

Incidentally, in the embodiment above, while alignment of the wafer was performed measuring the position of wafer W (fine movement stage WFS) via the laser interferometer system (not shown), besides this, a second fine movement stage position measurement system including a measurement arm having a configuration similar to measurement arm 71 of fine movement stage position measurement system 70 can be arranged in the vicinity of wafer alignment system ALG, and position measurement of the fine movement stage within the XY plane can be performed using this at the time of the wafer alignment. Further, in this case, correction of the Abbe error can be performed as in the manner previously described.

Incidentally, in the embodiment described above, the case has been described where the fine movement stage is supported movable with respect to the coarse movement stage, and a sandwich structure which vertically sandwiches a coil unit between a pair of magnetic units is employed as fine movement stage drive system 52 which drives the fine movement stage in directions of six degree of freedom. However, as well as this, the fine movement stage drive system can employ a structure where a magnet unit is vertically sandwiched by a pair of coil units, or a sandwich structure does not have to be employed. Further, a coil unit can be placed in the fine movement stage, and a magnet unit can be placed in the coarse movement stage.

Further, in the embodiment and described above, while the fine movement stage was driven in directions of six degrees of freedom by fine movement stage drive system 52, the fine movement stage does not necessarily have to be driven in directions of six degrees of freedom. For example, the fine movement stage drive system does not have to drive the fine movement stage in the θx direction.

Incidentally, in the embodiment above, while fine movement stage WFS is supported in a noncontact manner by coarse movement stage WCs by the action of the Lorentz force (electromagnetic force), besides this, for example, a vacuum preload type hydrostatic air bearings and the like can be arranged on fine movement stage WFS so that it is supported by levitation with respect to support coarse movement stage WCS. Further, fine movement stage drive system 52 is not limited to the magnet moving type described above, and can also be a moving coil type as well. Furthermore, fine movement stage WFS can also be supported in contact with coarse movement stage WCS. Accordingly, as fine movement stage drive system 52 which drives fine movement stage WFS with respect to coarse movement stage WCS, for example, a rotary motor and a ball screw (or a feed screw) can also be combined for use.

Incidentally, the fine movement stage position measurement system can be configured so that position measurement is possible within the total movement range of wafer stage WST. In this case, wafer stage position measurement system 16 will not be required. Further, in the embodiment above, base board 12 can be a counter mass which can move by an operation of a reaction force of the drive force of the wafer stage. In this case, coarse movement stage does not have to be used as a counter mass, or when the coarse movement stage is used as a counter mass as in the embodiment described above, the weight of the coarse movement stage can be reduced.

Incidentally, in the embodiment described above, while the case has been described where the entire fine movement stage position measurement system is made of, for example, glass, and is equipped with a measurement arm in which light can proceed inside, besides this, at least only the part where each of the laser beams previously described proceed in the measurement arm has to be made of a solid member through which light can pass, and the other sections, for example can be a member that does not transmit light, or have a hollow structure.

Further, as a measurement arm, for example, a light source or a photodetector can be built in the tip of the measurement arm, as long as a measurement beam can be irradiated from the section facing the grating. In this case, the measurement beam of the encoder does not have to proceed inside the measurement arm. Further, in the measurement arm, the part (beam optical path segment) where each laser beam proceeds can be hollow. Or, in the case of employing a grating interference type encoder system as the encoder system, the optical member on which the diffraction grating is formed only has to be provided on an arm that has low thermal expansion, such as for example, ceramics, Invar and the like. This is because especially in an encoder system, the space where the beam separates is extremely narrow (short) so that the system is not affected by air fluctuation as much as possible. Furthermore, in this case, the temperature can be stabilized by supplying gas whose temperature has been controlled to the space between fine movement stage (wafer holder) and the arm (and beam optical path). Furthermore, the measurement arm need not have any particular shape.

Further, the fine movement stage position measurement system does not always have to be equipped with a measurement arm, and will suffice as long as it has a head which is placed facing grating RG inside the space of the coarse movement stage and receives a diffraction light from grating RG of at least one measurement beam irradiated on grating RG, and can measure the positional information of fine movement stage WFS at least within the XY plane, based on the output of the head.

Further, in the embodiment above, while an example has been shown where encoder system 73 is equipped with an X head and a pair of Y heads, besides this, for example, one or two two-dimensional heads (2D heads) whose measurement directions are in two directions, which are the X-axis direction and the Y-axis direction, can be provided. In the case two 2D heads are provided, detection points of the two heads can be arranged to be two points which are spaced equally apart in the X-axis direction on the grating, with the exposure position serving as the center.

Incidentally, fine movement stage position measurement system 70 can measure positional information in directions of six degrees of freedom of the fine movement stage only by using encoder system 73, without being equipped with laser interferometer system 75. In this case, an encoder which can measure positional information, for example, in at least one of the X-axis direction and the Y-axis direction, and the Z-axis direction can also be used. As the encoder used in this case, a sensor head system for measuring variation disclosed in, for example, U.S. Pat. No. 7,561,280, can be used. And, for example, by irradiating measurement beams from a total of three encoders including an encoder (such as the sensor head system for measuring variation described above) which can measure positional information in the X-axis direction and the Z-axis direction and an encoder (such as the sensor head system for measuring variation described above) which can measure positional information in the Y-axis direction and the Z-axis direction, on three measurement points that are non-collinear, and receiving each of the return lights from grating RG, positional information of the movable body on which grating RG is provided can be measured in directions of six degrees of freedom. Further, the configuration of encoder system 73 is not limited to the embodiment described above, and is arbitrary. For example, a 3D head which can measure positional information in each of the X-axis, the Y-axis, and the Z-axis directions can be used.

Figure 11:
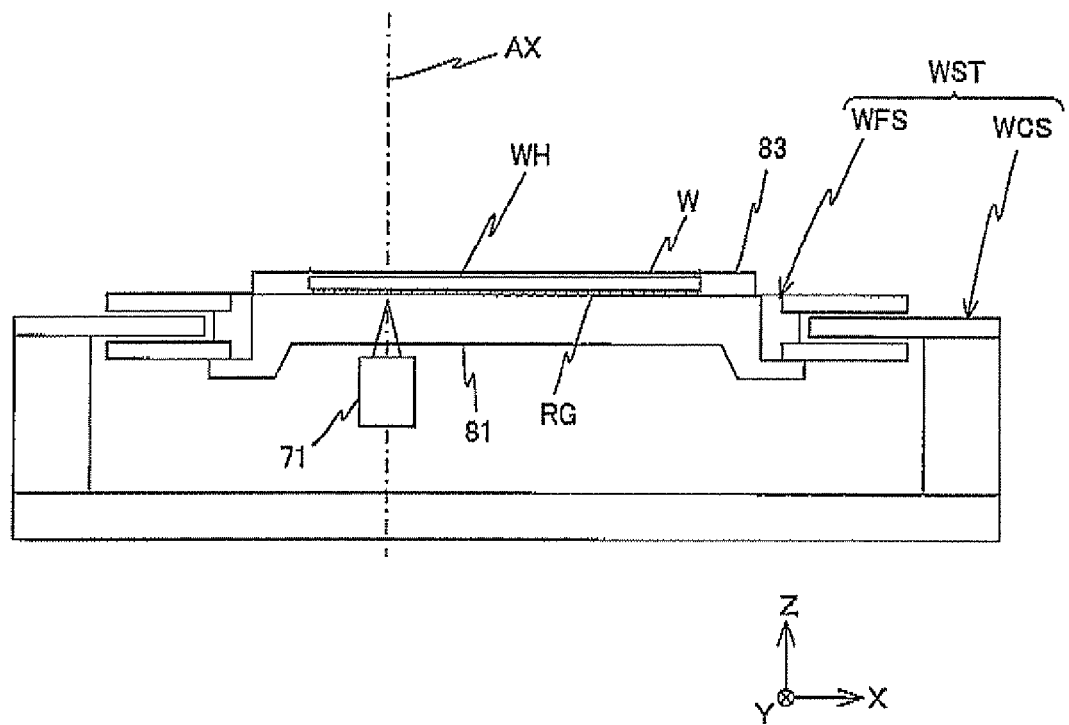
FIG. 11 is a view showing a placement of the grating related to a modified example.

Incidentally, in the embodiment above, while the grating was placed on the upper surface of the fine movement stage, that is, a surface that faces the wafer, as well as this, for example, grating RG can be formed on the lower surface of wafer holder WH which holds wafer W, as shown in FIG. 11. In this case, even when wafer holder WH expands or an installing position to fine movement stage WFS shifts during exposure, this can be followed up when measuring the position of the wafer holder (wafer). Grating RG can be fixed to the lower surface of wafer holder WH. In this case, a surface of the transparent plate on which grating RG is fixed or formed can be placed in contact or close to the rear surface of the wafer holder.

Further, grating RG can be placed on the lower surface of the fine movement stage, and in such a case, grating RG can be fixed to or formed on an opaque member such as ceramics. Further, in this case, the fine movement stage does not have to be a solid member through which light can pass because the measurement beam irradiated from the encoder head does not proceed inside the fine movement stage, and fine movement stage can have a hollow structure with the piping, wiring and like placed inside, which allows the weight of the fine movement stage to be reduced. In this case, a protective member (a cover glass) can be provided on the surface of grating RG. Or, the hold wafer holder and grating RG can simply be held by a conventional fine movement stage. Further, the wafer holder can be made of a solid glass member, and grating RG can be placed on the upper surface (a wafer mounting surface) of the glass member.

Further, in the embodiment above, the case has been described where the exposure apparatus is a liquid immersion type exposure apparatus. However, the present invention is not limited to this, and the embodiment above can also be applied suitably in a dry type exposure apparatus that performs exposure of wafer W without liquid (water).

Incidentally, in the embodiment above, while the case has been described where the exposure apparatus is a scanning stepper, besides this, the embodiment above can also be applied to a static exposure apparatus such as a stepper. Even in the case of a stepper, by measuring the position of a stage on which the object subject to exposure is mounted using an encoder, position measurement error caused by air fluctuation can substantially be nulled, which is different from when measuring the position of this stage using an interferometer, and it becomes possible to control the position of the stage with high precision based on the measurement values of the encoder, which in turn makes it possible to transfer a reticle pattern on the object with high precision. Further, the embodiment above can also be applied to a reduction projection exposure apparatus by a step-and-stitch method that synthesizes a shot area and a shot area.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catodioptric system, and in addition, this projected image may be either an inverted image or an upright image.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser, with a fiber amplifier doped with, for example, erbium (or both erbium and ytterbium), and by converting the wavelength into ultraviolet light using a non-linear optical crystal, can also be used as vacuum ultraviolet light.

In addition, the illumination light IL of the exposure apparatus 10 in the abovementioned embodiment is not limited to light with a wavelength of 100 nm or greater, and, of course, light with a wavelength of less than 100 nm may be used. For example, the embodiment above can be applied to an EUV exposure apparatus that uses an EUV (Extreme Ultraviolet) light in a soft X-ray range (e.g., a wavelength range from 5 to 15 nm). In addition, the embodiment above can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, because the stage where a wafer, a glass plate or the like is mounted is scanned with respect to the variable shaped mask, an equivalent effect as the embodiment above can be obtained by measuring the position of this stage using an encoder system and a laser interferometer system.

Further, as is disclosed in, for example, PCT International. Publication No. 2001/035168, the embodiment above can also be applied to an exposure apparatus (lithography system) that forms line-and-space patterns on a wafer W by forming interference fringes on wafer W.

Moreover, as disclosed in, for example, U.S. Pat. No. 6,611,316, the embodiment above can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs) micromachines, and DNA chips. In addition to fabricating microdevices like semiconductor devices, the embodiment above can also be adapted to an exposure apparatus that transfers a circuit pattern to a glass substrate, a silicon wafer, or the like in order to fabricate a reticle or a mask used by a visible light exposure apparatus, an EUV exposure apparatus, an X-ray exposure apparatus, an electron beam exposure apparatus, and the like.

Incidentally, the movable body apparatus of the present invention can be applied not only to the exposure apparatus, but can also be applied widely to other substrate processing apparatuses (such as a laser repair apparatus, a substrate inspection apparatus and the like), or to apparatuses equipped with a movable stage of a position setting apparatus of a sample or a wire bonding apparatus in other precision machines.

Incidentally, the disclosures of all publications, the PCT International Publications, the U.S. Patent Applications and the U.S. Patents that are cited in the description so far related to exposure apparatuses and the like are each incorporated herein by reference.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiment of the present invention is the presently preferred embodiment thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body apparatus, comprising:
   a movable body which is movable substantially along a predetermined plane holding an object, and has a grating placed on a rear surface side of the object substantially parallel with the predetermined plane;
   a measurement system which irradiates a measurement light of a predetermined wavelength toward the grating on an opposite side of a mounting surface of the object, receives diffraction light from the grating originating from the measurement light, and measures positional information of the movable body in a measurement direction within the predetermined plane; and
   a drive system which drives the movable body, based on the positional information in the measurement direction of the movable body and correction information of a measurement error caused by a tilt of the movable body included in the positional information, wherein
   the movable body has a space inside, and
   the measurement system has a measurement member which is located in the space when the movable body is in an area within a predetermined range including a predetermined point where the movable body is to be positioned in the predetermined plane, and on the measurement member, at least a part of a head is provided which irradiates the measurement light on the grating and receives a diffraction light from the grating originating from the measurement light.

2. The movable body apparatus according to claim 1, further comprising:
   a tilt measurement system which measures tilt information with respect to the predetermined plane of the movable body.

3. The movable body apparatus according to claim 2, wherein the correction information includes a first correction information on a measurement error which occurs due to a tilt of the movable body corresponding to a distance between a surface of the object and a plane on which the grating of the movable body is placed.

4. The movable body apparatus according to claim 3, wherein the correction information further includes a second correction information on a measurement error which occurs due to a tilt of the plane on which the grating of the movable body is placed.

5. The movable body apparatus according to claim 4, further comprising:
   a controller which makes the movable body vary in a plurality of different attitudes based on the positional information and the tilt information, measures positional information in the measurement direction of the movable body at different positions in a direction perpendicular to the predetermined plane while maintaining each attitude, and performs one of making and revising the second correction information based on the positional information.

6. The movable body apparatus according to claim 2, wherein the tilt measurement system irradiates at least three measurement beams that have a wavelength different from the predetermined wavelength on a plane substantially parallel to the predetermined plane of the movable body, and receives a reflected light from the movable body of each of the measurement beams.

7. The movable body apparatus according to claim 1, wherein the drive system corrects one of a target position to drive the movable body and the positional information, based on the correction information.

8. The movable body apparatus according to claim 1, wherein
   the grating includes a diffraction grating whose periodic direction is in a direction which is one of a first and a second directions parallel to a first axis and a second axis, respectively, which are orthogonal to each other within the predetermined plane, and
   the measurement system measures positional information in the one direction of the movable body.

9. The movable body apparatus according to claim 8, wherein
   the grating further includes a diffraction grating whose periodic direction is in the other direction of the first and the second directions within the predetermined plane, and
   the measurement system measures positional information of the movable body in the other direction as well.

10. The movable body apparatus according to claim 9, wherein the grating is a two-dimensional grating whose periodic directions are in the first and the second directions.

11. The movable body apparatus according to claim 1, wherein
    the grating is placed between the mounting surface of the object of the movable body and a plane parallel to the predetermined plane opposite to the mounting surface, and
    the measurement system irradiates the measurement light on the grating.

12. The movable body apparatus according to claim 1, wherein the movable body includes a holding member which holds the object and also has the grating placed at a rear surface of the holding member, and a table on which the holding member is mounted and whose inside the measurement light is transmitted.

13. The movable body apparatus according to claim 12, wherein the holding member is detachable with respect to the table.

14. The movable body apparatus according to claim 1, wherein the movable body includes a transparent member on which the measurement light is incident and which also has the grating formed on a surface substantially parallel to the predetermined plane, and a holding member that holds the object and is also arranged on the surface side with respect to the transparent member.

15. The movable body apparatus according to claim 1, further comprising:
    a movable member which can movably support the movable body relatively at least within a plane parallel to the predetermined plane, and can move at least along the predetermined plane, whereby
    the drive system drives the movable body in one of an individual manner and an integral manner with the movable member.

16. The movable body apparatus according to claim 1, wherein the measurement light is irradiated on one of the predetermined point and in a vicinity of the predetermined point.

17. An exposure apparatus that forms a pattern on an object by an irradiation of an energy beam, the apparatus comprising:
   a patterning device that irradiates the energy beam on the object; and
   the movable body apparatus according to claim 1 in which the object on which an energy beam is irradiated is held by the movable body.

18. The exposure apparatus according to claim 17, wherein the measurement light is irradiated on a predetermined point in an irradiation area of the energy beam.

19. The exposure apparatus according to claim 18, wherein the predetermined point is an exposure center of the patterning device.

20. A device manufacturing method, including
   exposing a substrate using the exposure apparatus according to claim 17; and
   developing the substrate which has been exposed.

21. An exposure method in which an energy beam is irradiated on an object to form a predetermined pattern on the object, the method comprising:
   measuring positional information of a movable body, which holds the object and also has a grating placed substantially parallel to a predetermined plane on a rear surface side of the object, in a measurement direction within the predetermined plane, by moving the movable body along the predetermined plane, irradiating a measurement light of a predetermined wavelength toward the grating on an opposite side of a mounting surface of the object, and receiving a diffraction light from the grating originating from the measurement light; and
   driving the movable body, based on the positional information in the measurement direction of the movable body and correction information of a measurement error caused by a tilt of the movable body included in the positional information, wherein
   the movable body has a space inside, and
   in the measuring, the measurement is performed using a head, at least a part of the head being provided on a measurement member located in the space when the movable body is in an area within a predetermined range including a predetermined point where the movable body is to be positioned in the predetermined plane, and the head irradiating the measurement light on the grating and receiving a diffraction light from the grating originating from the measurement light.

22. The exposure method according to claim 21, further comprising:
   measuring tilt information with respect to the predetermined plane of the movable body, wherein
   in the driving, the movable body is driven based on the positional information in the measurement direction of the movable body and the correction information of the measurement error corresponding to the tilt information which has been measured.

23. The exposure method according to claim 22, wherein the correction information includes a first correction information on a measurement error which occurs due to a tilt of the movable body corresponding to a distance between a surface of the object and a plane on which the grating of the movable body is placed.

24. The exposure method according to claim 23, wherein the correction information further includes a second correction information on a measurement error which occurs due to a tilt of the plane on which the grating of the movable body is placed.

25. The exposure method according to claim 24, further comprising:
   performing one of making and revising the second correction information, by making the movable body vary in a plurality of different attitudes based on the positional information and the tilt information, measuring positional information in the measurement direction of the movable body at different positions in a direction perpendicular to the predetermined plane while maintaining each attitude, and performing one of making and revising the second correction information based on the positional information that has been measured.

26. The exposure method according to claim 22, wherein on measuring the tilt information, a measurement system is used which irradiates at least three measurement beams that have a wavelength different from the predetermined wavelength on a plane substantially parallel to the predetermined plane of the movable body, and receives a reflected light from the movable body of each of the measurement beams.

27. The exposure method according to claim 21, wherein in the driving, one of a target position to drive the movable body and the positional information is corrected, based on the correction information.

28. The exposure method according to claim 21, wherein
   the grating includes a diffraction grating whose periodic direction is in a direction which is one of a first and a second directions parallel to a first axis and a second axis, respectively, which are orthogonal to each other within the predetermined plane, and
   in the measuring, positional information in the one direction of the movable body is measured.

29. The exposure method according to claim 28, wherein
   the grating further includes a diffraction grating whose periodic direction is in the other direction of the first and the second directions within the predetermined plane, and
   in the measuring, positional information of the movable body in the other direction is measured as well.

30. The exposure method according to claim 29, wherein the grating is a two-dimensional grating whose periodic directions are in the first and the second directions.

31. The exposure method according to claim 21, wherein
   the grating is placed between the mounting surface of the object of the movable body and a plane parallel to the predetermined plane opposite to the mounting surface, and
   in the measuring, the measurement light is irradiated on the grating, and a diffraction light from the grating originating from the measurement light is received.

32. The exposure method according to claim 21, wherein the movable body includes a holding member which holds the object and also has the grating placed at a rear surface of the holding member, and a table on which the holding member is mounted and whose inside the measurement light is transmitted.

33. The exposure method according to claim 32, wherein the holding member is detachable with respect to the table.

34. The exposure method according to claim 21, wherein the movable body includes a transparent member on which the measurement light is incident and which also has the grating formed on a surface substantially parallel to the predetermined plane, and a holding member that holds the object and is also arranged on the surface side with respect to the transparent member.

35. The exposure method according to claim 21, further comprising:
supporting the movable body by a movable member which is movable at least along the predetermined plane, relatively movable at least within a plane parallel to the predetermined plane, whereby
in the driving, the movable body is driven in one of an individual manner and an integral manner with the movable member.

36. The exposure method according to claim 21, wherein the measurement light is irradiated on one of the predetermined point and in a vicinity of the predetermined point.

37. The exposure method according to claim 21, wherein the measurement light is irradiated on a predetermined point in an irradiation area of the energy beam.

38. The exposure method according to claim 37, wherein the predetermined point is an exposure center.

39. A device manufacturing method, including
exposing a substrate using the exposure method according to claim 21; and
developing the substrate which has been exposed.

* * * * *